United States Patent [19]

Iwaoka et al.

[11] Patent Number: 4,651,097
[45] Date of Patent: Mar. 17, 1987

[54] EXAMINATION METHOD AND APPARATUS UTILIZING NUCLEAR MAGNETIC RESONANCE

[75] Inventors: Hideto Iwaoka; Tadashi Sugiyama; Hiroyuki Matsuura, all of Tokyo, Japan

[73] Assignee: Yokogawa Hokushin Electric Corporation, Tokyo, Japan

[21] Appl. No.: 659,409

[22] Filed: Oct. 10, 1984

[30] Foreign Application Priority Data

Oct. 12, 1983 [JP] Japan ................................ 58-190581
Jan. 19, 1984 [JP] Japan .................................. 59-7707

[51] Int. Cl.$^4$ ........................................... G01R 33/20
[52] U.S. Cl. ..................................... 324/309; 324/307
[58] Field of Search ................ 324/309, 307, 311, 300

[56] References Cited

U.S. PATENT DOCUMENTS

| | | | |
|---|---|---|---|
| 4,115,730 | 9/1978 | Mansfield | 324/309 |
| 4,284,948 | 8/1981 | Young | 324/309 |
| 4,471,305 | 9/1984 | Crooks et al. | 324/309 |
| 4,484,138 | 11/1984 | Bottomley et al. | 324/307 |
| 4,502,008 | 2/1985 | Ohuchi | 324/311 |
| 4,521,733 | 6/1985 | Bottomley et al. | 324/309 |
| 4,532,473 | 7/1985 | Wehrli | 324/309 X |
| 4,532,474 | 7/1985 | Edelstein | 324/309 |
| 4,536,712 | 8/1985 | Iwaoka et al. | 324/309 |
| 4,549,139 | 10/1985 | MacFall et al. | 324/309 |
| 4,567,440 | 1/1986 | Haselgrave | 324/309 |
| 4,568,880 | 2/1986 | Sugimoto | 324/309 |
| 4,579,121 | 4/1986 | Macovsky | 324/309 |

FOREIGN PATENT DOCUMENTS 2089996 6/1982 United Kingdom ................ 324/307

OTHER PUBLICATIONS

General Electric, Basic Information About Magnetic Resonance Tomography, General Electric Co., Medical Systems Operations, 1983.

Primary Examiner—Michael J. Tokar
Assistant Examiner—Scott M. Oldham
Attorney, Agent, or Firm—Moonray Kojima

[57] ABSTRACT

In an examination method and apparatus utilizing nuclear magnetic resonance, high frequency pulses for producing nuclear magnetic resonance are applied by successively imposing a first 90° pulse, a first 180° pulse, a second 90° pulse, and a second 180° pulse substantially immediately after the second 90° pulse, and a next pulse sequence is initiated upon elapse of a wait time after the second 180° pulse has been applied. The wait time is rendered much shorter than the conventional prior art wait times for high speed scanning operation, by forcibly aligning magnetization M first with the direction of a −Z direction axis and then with the direction of a +Z direction axis, using the second 90° pulse and the second 180° pulse. By applying a number of first 180° pulses, a number of nuclear magentic resonance signals are produced for additionally shortening the overall measurement time.

47 Claims, 33 Drawing Figures

FIG.1
(a) 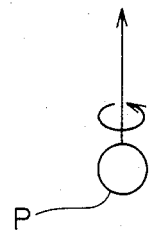
(b) 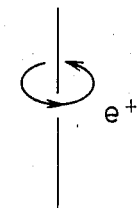
FIG.2
(a) 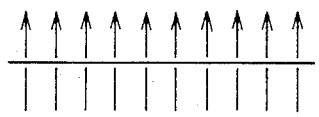
(b) 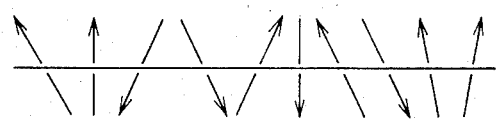
FIG.3
(a) 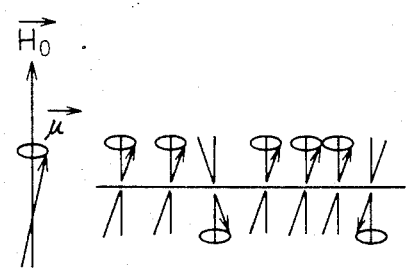
(b) 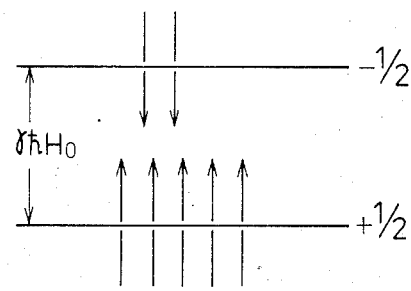

Sliced Thickness

Sliced Thickness

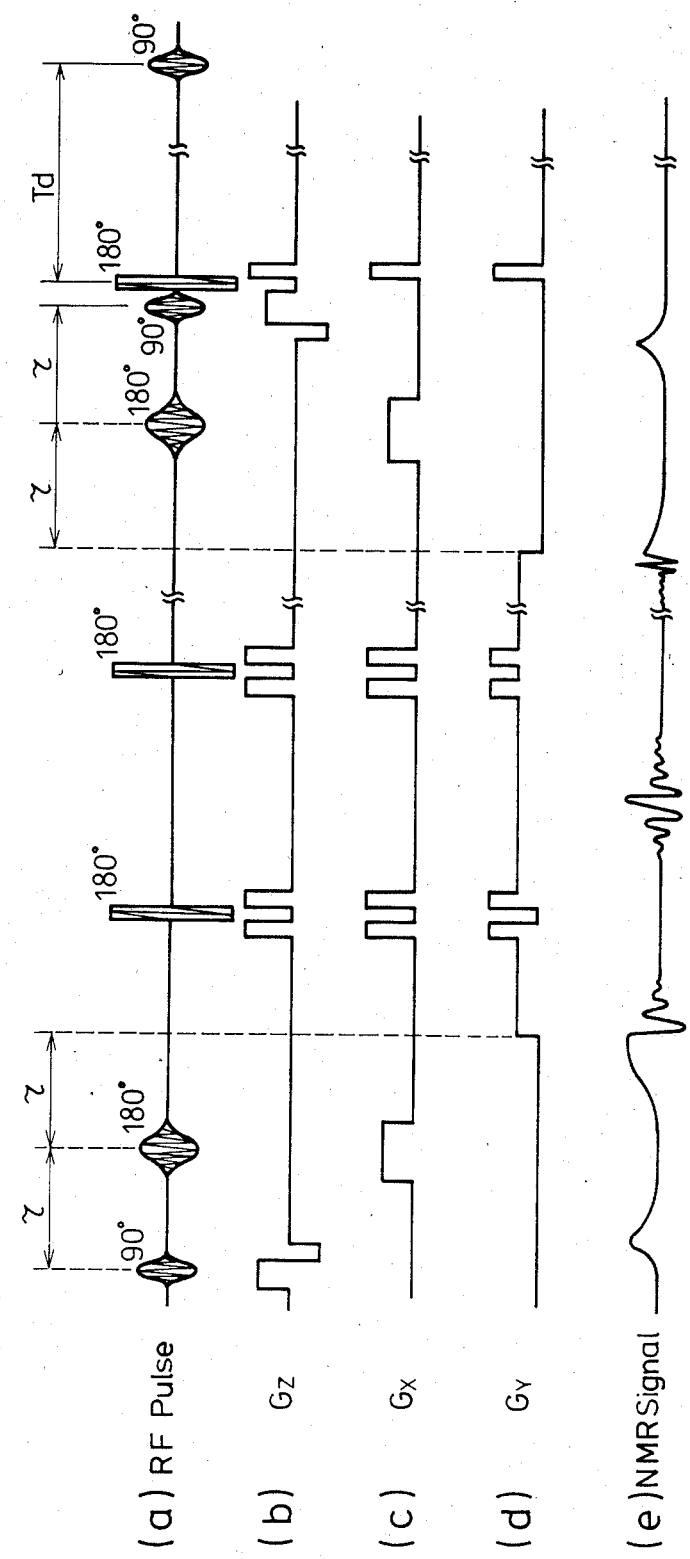

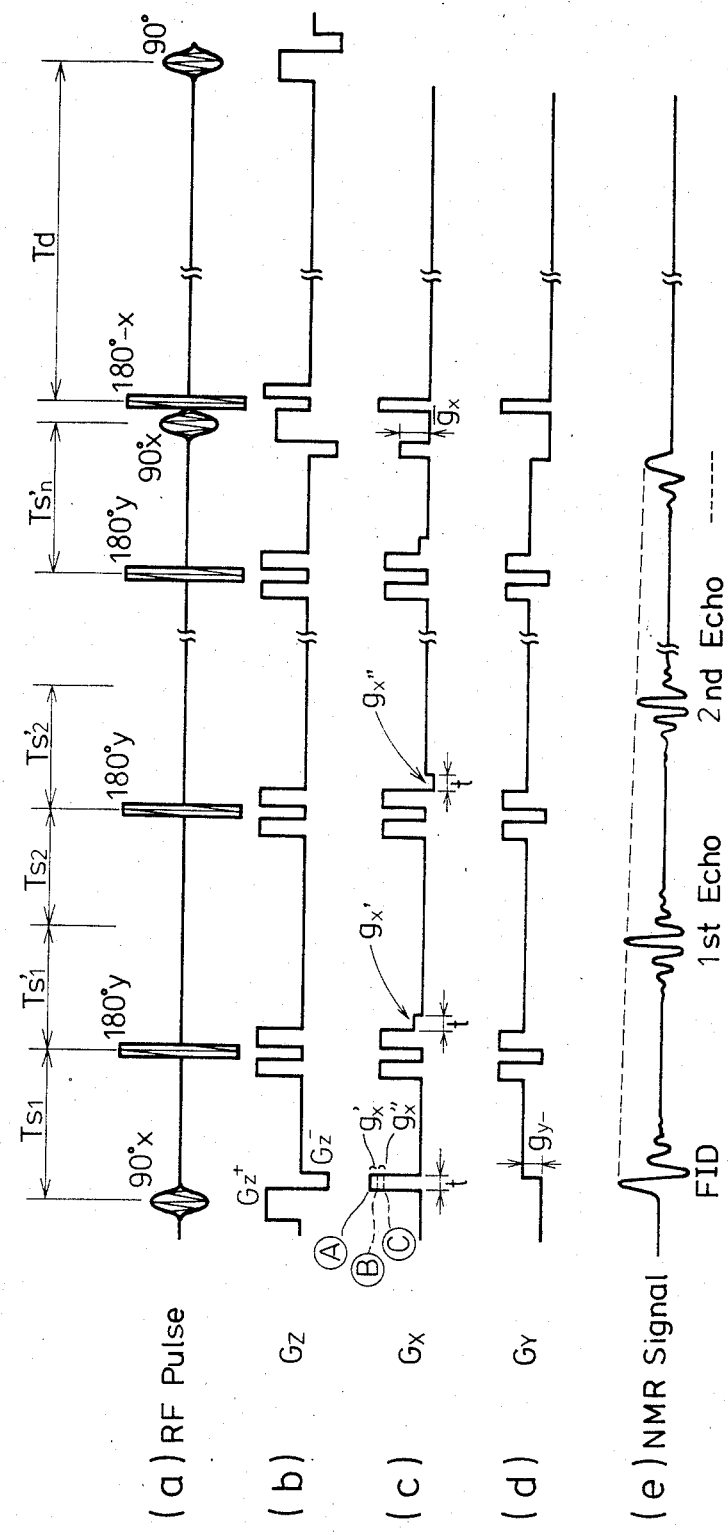

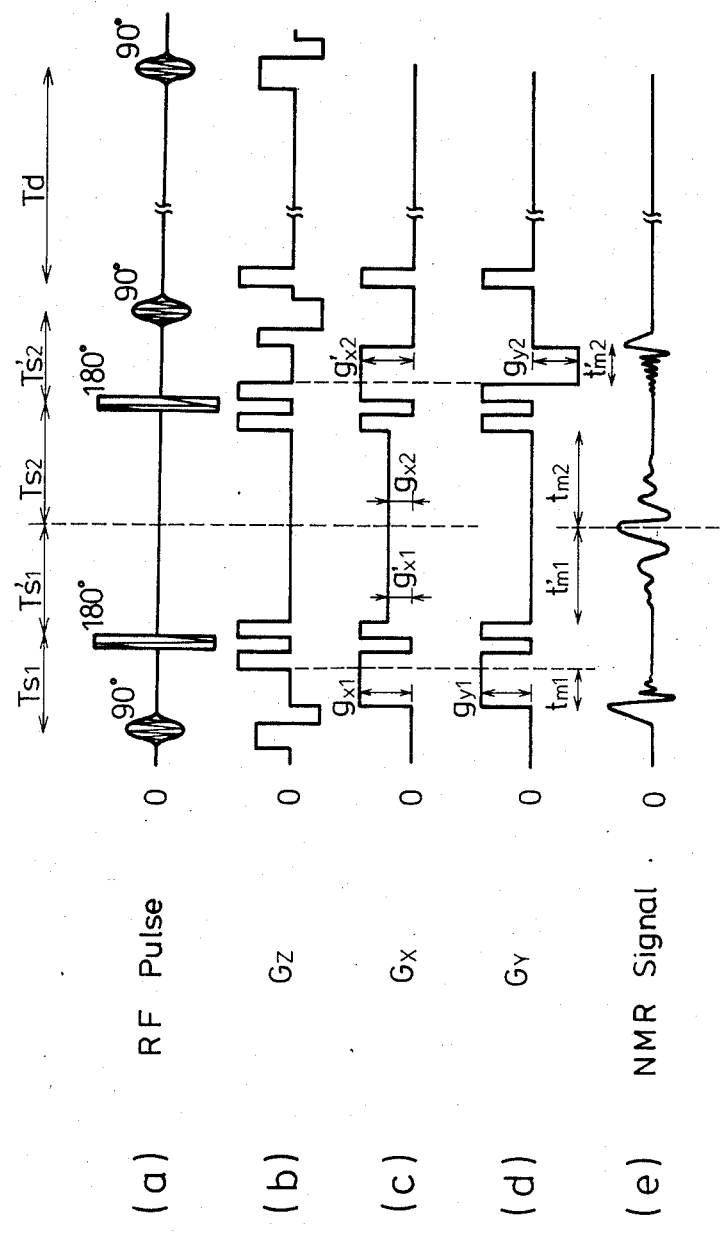

EXAMINATION METHOD AND APPARATUS UTILIZING NUCLEAR MAGNETIC RESONANCE

BACKGROUND OF THE INVENTION.

1. Field of Invention

This invention relates to an examination method and apparatus utilizing nuclear magnetic resonance (hereinafter called "NMR") for externally determining a distribution of certain atomic nuclei or the like within a body being examined; and more particularly, to an improved NMR imaging apparatus for use in medical equipment.

2. Description of Prior Art

The principles of nuclear magnetic resonance are well known, and may be explained with reference to FIGS. 1(a), 1(b), 2(a), 2(b), 3(a) and 3(b). An atomic nucleus comprises protons and neutrons (one proton in case of hydrogen) which are regarded as rotating with angular momentum of nuclear spin $\vec{I}$. FIGS. 1(a) and 1(b) show an atomic nucleus of hydrogen ($^1H$) As shown in FIG. 1(a), the atomic nucleus comprises one proton P which rotates with a spin quantum number $\frac{1}{2}$. Since the proton P has a positive charge $e^+$ as shown FIG. 1(b), there is a magnetic moment $\vec{M}$. Therefore, each atomic nucleus of hydrogen can be regarded as one small magnet.

FIGS. 2(a) and 2(b) schematically illustrate such a magnetic property of atomic nuclei. In the case of a ferromagnetic material such as iron, small magnets represented by atomic nuclei are oriented uniformly as shown in FIG. 2(a), so that the atomic nuclei, as a whole, exhibit magnetization. With respect to hydrogen, however, small magnets (magnetic moments) are directed at random, as illustrated in FIG. 2 (b), and fail to exhibit magnetization.

When the material, such as hydrogen or the like, is placed in a static magnetic field $H_0$ applied in the direction of Z, all atomic nuclei are oriented in the direction of $H_0$. In other words, the nuclear energy levels are quantized in the direction of Z.

FIG. 3(a) shows the manner in which atomic nuclei of hydrogen are oriented in a static field. As the spin quantum number of hydrogen is $\frac{1}{2}$, the energy levels are divided into two energy levels of $-\frac{1}{2}$ and $+\frac{1}{2}$, as shown in FIG. 3(b), with the energy difference $\Delta E$ therebetween being expressed by the following equation:

$$\Delta E = \gamma h\, H_0 \quad (1)$$

wherein $\gamma$ is the gyromagnetic ratio; $h = h/2\pi$; $h =$ Planck's constant. Each atomic nucleus is subjected to the force $\vec{M} \times \vec{H}_0$ due to the static field $\vec{H}_0$, and hence revolves about the Z axis in processional movement with an angular velocity given by the following equation:

$$\omega = \gamma H_0 \text{ (Lamour angular velocity)} \quad (2)$$

When the system under such motion is subjected to an electromagnetic wave (normally a radio frequency wave) having a frequency corresponding to the angular velocity $\omega$, resonance occurs, and the atomic nucleus absorbs an amount of energy corresponding to the energy difference $\Delta E$ expressed by the equation (1) and is transferred to the higher energy level. Different kinds of atomic nuclei with angular momentum of nuclear spin have different gyromagnetic ratios $\gamma$, and, therefore, resonate with respective different frequencies. As a result, resonance of desired atomic nuclei of a certain element can be ascertained. The quantity of atomic nuclei which exist can be determined by measuring the intensity of resonance. Those atomic nuclei which have been transferred to the higher energy level will return to the lower energy level upon elapse of a period of time determined by a time constant called "relaxation time".

Relaxation times are classified into a spin-lattice relaxation time (longitudinal relaxation time) $T_1$ and a spin-spin relaxation time (transverse relaxation time) $T_2$. Data on a material distribution can be obtained by observing the relaxation times. In solids, generally, spins are substantially fixed in given positions over the crystal lattice, so that the spins tend to act mutually. Thus, the relaxation time $T_2$ is short and the energy produced by nuclear magnetic resonance is first given well through the spin system, and then to the lattice system.

Accordingly, the time $T_1$ is much longer than the time $T_2$. In liquids, molecules move freely, and energy exchange between spins and that between spins and the molecule system (lattice) take place with substantially the same ease. Thus, the times $T_1$, $T_2$ are approximately equal to each other. The time $T_1$ in particular is a time constant dependent on the manner in which the compound molecules are coupled. It is known that the time $T_1$ with a malignant tumor, for example, is substantially different from the Time $T_1$ with, for example, a normal tissue.

Although NMR has been described above with reference to hydrogen atomic nuclei ($^1H$), the same measurements can be achieved with other atomic nuclei having angular momentums of nuclear spin, such as the atomic nuclei of phosphorus ($^{31}P$), carbon ($^{13}C$), sodium ($^{23}Na$), fluorine ($^{19}F$), oxygen ($^{17}O$), and other elements.

Since the quantity of certain existing atomic nuclei and their relaxation times can be measured, various kinds of examinations of an object body can be made by obtaining various items of chemical information about particular atomic nuclei contained with a material.

There has been proposed, conventionally, an NMR examination apparatus which operates on the same principle as that of an X-ray CT (computerized tomograph) by exciting protons in a hypothetical section of a body being examined, obtaining an NMR resonance signal corresponding to each projection for many directions across the body, and determining the intensity of the NMR resonance signal in each position of the body through a reconstructive method.

FIG. 4 depicts waveforms of signals of an examination process used in a conventional apparatus. First, an object to be examined is subjected to a x-gradient magnetic field $Gz^+$, as indicated in line (b) of FIG. 4, and RF pulses (90° pulses) having a narrow fequency spectrum, such as shown in line (a) of FIG. 4. At this time, protons only in the plane in which the Lamour angular velocity is given by below equation (3) are excited.

$$\omega = \gamma(H_0 + \Delta Gz) \quad (3)$$

Magnetization M has its direction shifted through 90° into alignment with the y' axis if expressed on a coordinate system, such as shown in FIG. 5(a), as it rotates with the angular velocity $\omega$. Then, an x-gradient magnetic field Gx and a y-gradient magnetic field Gy are applied as shown in FIG. 4, line (c) and line (d), to produce a two-dimensional gradient magnetic field for detecting an NMR resonance signal (FID signal = Free Induction Decay signal). Since the magnetization M is scattered gradually in the directions of the arrows within the x'-y' plane, as depicted in FIG. 5(b), the NMR resonance signal is reduced until it is eliminated upon elapse of a time Ts as shown in FIG. 4, line (e). By subjecting the NMR resonance signal thus obtained to a Fourier transform, a projection is obtained which is perpendicular to a gradient magnetic field which comprises the x-gradient magnetic field Gx and the y-gradient magnetic field Gy.

Upon elapse of a given period of time Td, a next sequence is repeated in the same operation as described above. In successive sequences, Gx and Gy are gradually changed. NMR resonance signals can thus be obtained in many directions across the object body for respective projections.

With the conventional apparatus thus described, the time Ts in which the NMR resonance signal entirely disappears, ranges from 10 to 20 mS, and the time Td required for transition to a next sequence is about 1 sec. because of the relaxation time $T_1$. Therefore, provided that one body sectional plane is to be reconstructed with 128 projections, for example, the measurement requires at least two minutes. This is a substantial obstacle to high speed operation.

Also known in the art is a technique known as the DEFT process, which means Driven Equilibrium Fourier Transform, reported in Journal of the American Chemical Society, 91:27, Dec. 31, 1969, pages 7784–7785. This DEFT process has been proposed for use in NMR analyzers. However, no where in the art has there been any disclosure wherein the DEFT process has been utilized in or even suggested for use in the NMR imaging apparatus.

Briefly, the DEFT process uses a pulse sequence for high speed operation which comprises, for example, $(90° \text{ x} \ldots \tau \ldots 180° \text{ y} \ldots \tau \ldots 90° -\text{x} \ldots \text{Td})^n$.

The following discussion is not a part of the prior art, but represents theoretical investigations leading up to and including the invention. For example, when effecting two dimensional imaging with the DEFT process, 90° pulses would tend to excite protons within a particular slice plane with a selective excitation method (a gradient field being simultaneously applied), and no problem arises out of this procedure. The 180° pulse would excite protons with both selective and non-selective methods.

FIG. 23 illustrates the results, as simulated by a computer and using the Bloch equations, of a distribution of magnetization Mz on the z axis immediately prior to the first 90° pulse in the direction of a sliced thickness. The 90° pulse is subjected to Gaussian modulation for selective excitation. The results were computed by using average $T_1$, $T_2$ and $Tr = 100$ mS (repetitive time) of a living body. Mz is assumed to be 1 prior to execution of the pulse sequence and has a magnitude corresponding to an NMR signal intensity.

With non-selective 180°-pulse for the DEFT process, Mz outside of the slice plane is quite small, as indicated by the dot and dash line A in FIG. 23.

A multi-slice method has generally been employed in which during the wait time Td for a pulse sequence, identical pulse sequences are successively applied to other plural slice planes, and after Mz has been subjected to longitudinal relaxation time $T_1$ due to the sufficiently long Td during that time, a view next to the first slice plane is obtained. This method is effective as a quasi-high speed method since the NMR signal (magnitude of Mz) is prevented from being reduced, and at the same time, data on a plurality of planes can be attained. However, the multi-slice method requires that Mz outside of the slice plane be large without being affected by excitation in other slice planes.

The above requirement leads to the shortcoming wherein the DEFT process using non-selective 180°-pulses cannot be used with the multi-slice method since Mz outside of the slice plane is small. An actual slice configuration is expressed by Mz of FIG. 23, as multiplied by a slice shape function (Gaussian type in the illustrated example), and is shown in FIG. 24.

There is no problem with selective 180°-pulses for the DEFT process since Mz outside of the slice plane is large as indicated by the dash line B in FIG. 23. However, the slice shape is disadvantageous in that it has three peaks as shown in FIG. 24. This is because, upon application of selective excitation 180°-pulses, the magnetization M in a slice interface acts in a complex manner to make vector directions of M different from each other, with the result that the signal is reduced.

As above described, the conventional DEFT process, as it now exists, is not suitable for use in the NMR imaging apparatus.

SUMMARY OF THE INVENTION

Accordingly, an object of the invention is to overcome the above and other deficiencies and disadvantages of the prior art, and to improve the prior art.

Another object is to provide an examination method and apparatus utilizing NMR, wherein at the time a series of sequences have been completed, magnetization vectors are forcibly oriented properly upwardly (in a positive direction along the z axis) to allow immediate transition to a next sequence, so that the total operating time can be shortened.

According to the invention, there is provided an examination method utilizing nuclear magnetic resonance wherein magnetic fields and high frequency pulses are applied to the nuclei of atoms constituting a part, such as tissue, of an object being examined, to cause the nuclei to effect nuclear magnetic resonance, for reconstructing an image of the body part, based on a produced nuclear magnetic resonance signal. The examination method comprises the steps of successively applying as the high frequency pulses a first 90° pulse, a first 180° pulse, a second 90° pulse, and a second 180° pulse substantially immediately after the second 90° pulse, and detecting a necessary nuclear magnetic resonance signal produced in a period $T_{s1}$ between the first 90° pulse and the first 180° pulse or in a period $T_{s2}$ between the first 180° pulse and the second 90° pulse.

The invention encompasses an apparatus comprising means for applying a static field ($H_0$) to an object being examined, means for applying a gradient field to the object, means for applying high frequency pulses to cause the nuclei of atoms constituting a part, for example tissue, of the object, to effect nuclear magnetic resonance, means for detecting a nuclear magnetic resonance signal, and means for reconstructing an image of the part from the detected nuclear magnetic resonance signal.

The apparatus further comprises control means for successively applying as the high frequency pulses a first 90° pulse, a first 180° pulse, a second 90° pulse, and a second 180° pulse substantially immediately after the second 90° pulse, for energizing the gradient field applying means to apply the gradient field thereby to enable the first and second 90° pulses to effect selective excitation for exciting only a particular slice plane and de-energizing the gradient field applying means to not apply the gradient field and thereby enable the first and second 180° pulses to effect non-selective excitation, for applying the second 180° pulse substantially immediately after the second 90° pulse has been applied, and for detecting a necessary nuclear magnetic resonance signal produced in a period $T_{s1}$ between the first 90° pulse and the first 180° pulse or a period $T_{s2}$ between the first 180° pulse and the second 90° pulse.

BRIEF DESCRIPTION OF DRAWINGS

FIGS. 1(a) and 1(b) are diagrams which explain the spin of a hydrogen atom.

FIGS. 2(a) and 2(b) are schematic diagrams depicting magnetic moment of a hydrogen atom.

FIGS. 3(a) and 3(b) are diagrams depicting the manner in which atomic nuclei of hydrogen are oriented in the direction of an applied magnetic field applied.

FIGS. 13 through 18, 20, 21, and 25 through 33 are diagrams depicting signal waveforms according to other embodiments of the invention.

DESCRIPTION OF PREFERRED EMBODIMENTS.

Figure 6:
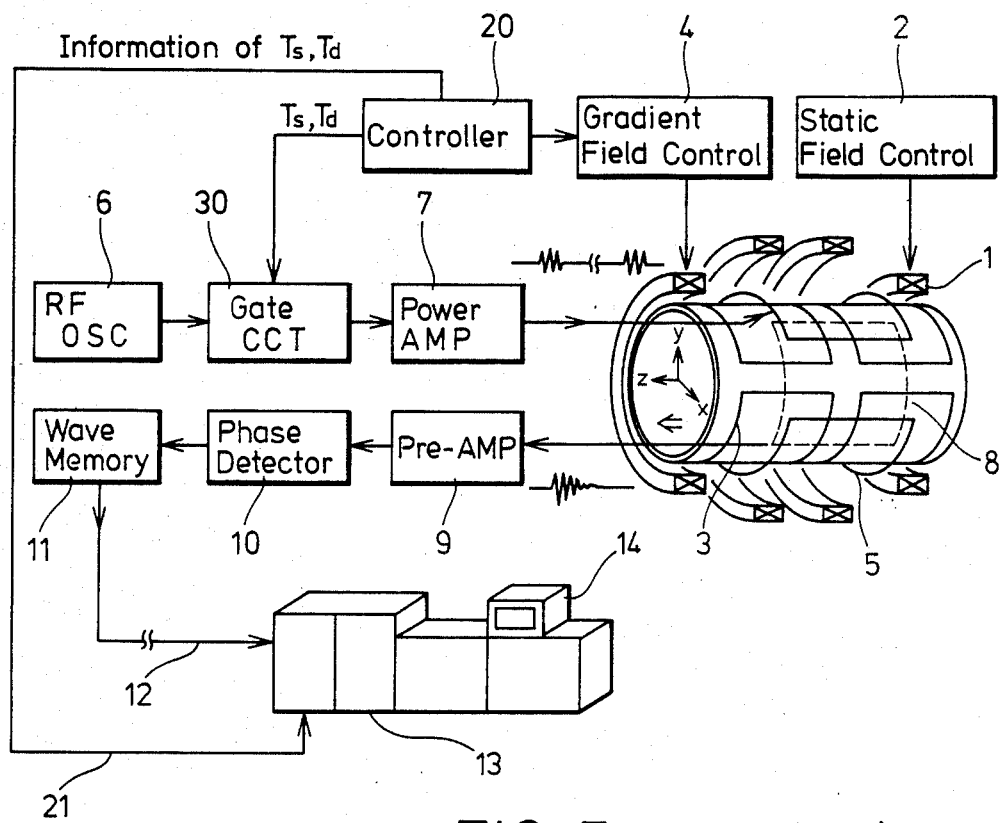
FIG. 6 is a block diagram depicting an illustrative embodiment of the invention.

Turning now to FIG. 6, a uniform static magnetic field $H_0$ is generated in the direction of Z by a static field coil 1 controlled by a static field control circuit 2, including a DC regulated power supply. It is preferable that a magnetic flux generated by static field coil 1 have a density $H_0$ of about 0.1 T and a degree of uniformity of $10^{-4}$ or more.

A gradient field coil is generally designated at 3 and controlled by a gradient field control circuit 4.

Figure 7:
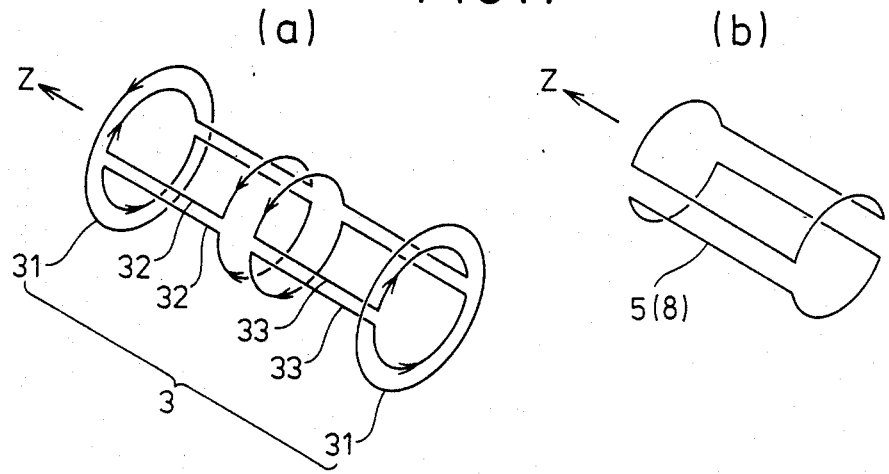
FIGS. 7(a) and 7(b) are diagrams depicting field and exciting coils.

FIG. 7(a) shows a representative arrangement of gradient field coil 3. Gradient field coil 3 comprises a z-gradient field coil 31, a y-gradient field coil 32, and an x-gradient coil (not shown) which is identical in shape to the y- and z-gradient field coils 32, 33 and angularly spaced 90° therefrom. Gradient field coil 3 generates a magnetic field in the same direction as that of the uniform static field $H_0$ and having linear gradients in the directions of x, y, and z axes. Control circuit 4 is controlled by a controller 20, which will be described hereinbelow in greater detail.

An exciting coil 5 applies RF pulses as an electromagnetic wave to a body being examined, and is constructed as shown in FIG. 7(b).

An oscillator 6 generates a signal having a frequency (e.g. 42.6 MHz/T for protons) corresponding to an NMR condition for the particular atomic nuclei used, and applies the output signal to exciting coil 5 through a gate circuit 30 controlled by a signal from controller 20 and power amplifier 7. An NMR resonance signal from the object is detected by a detector coil 8 of a construction similar to the exciting coil shown in FIG. 7(b). The detector coil 8 is angularly spaced 90° from exciting coil 5. Detector coil 8 should preferably be located as closely to the object as possible. If necessary, detector coil 8 may double as exciting coil 5.

The apparatus also includes a preamplifier 9 for amplifying an NMR resonance signal (FID which means Free Induction Decay) obtained from detector coil 8, a phase detector 10, a wave memory 11 for storing a phase detected waveform signal from preamplifier 9, (wave memory 11 includes an A/D converter), a computer 13 for receiving a signal from wave memory 11 through a transmission line comprising an optical fiber and for generating a tomographic image by processing the received signal, and a display 14, such as a television monitor, for displaying the generated tomographic image. Necessary information is transmitted from controller 20 to computer 13 through signal line 21.

Figure 8:
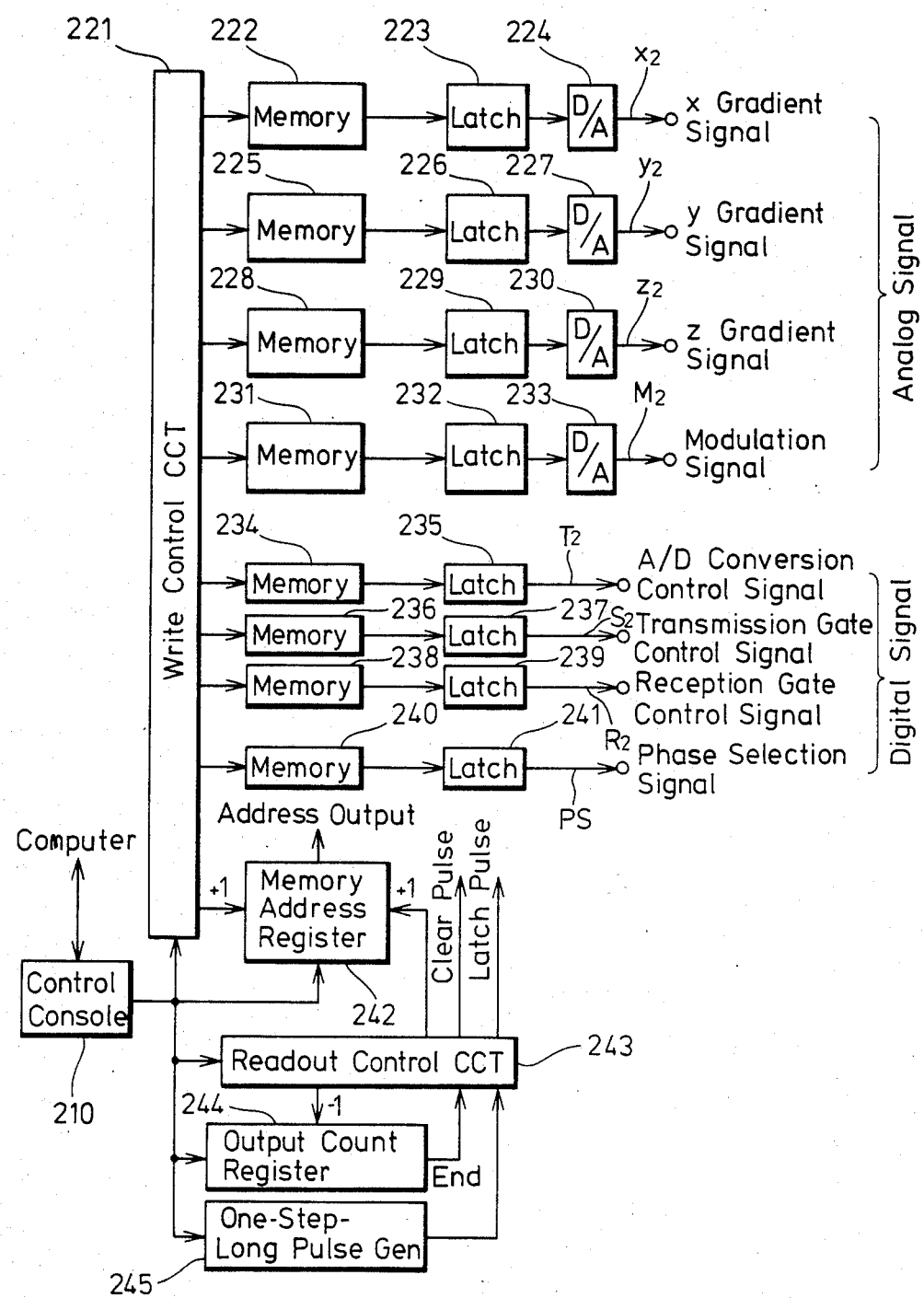
FIG. 8 is a block diagram depicting details of a controller.

Controller 20 is capable of issuing signals (analog signals) required for controlling the gradient fields Gz,Gx,Gy and control signals (digital signals) required for transmitting RF pulses and receiving NMR signals. FIG. 8 illustrates one example of such a controller which is capable of high speed control and of varying the control sequence and analog waveforms with ease.

The controller shown in FIG. 8 includes a write control circuit 221 for writing into memories data coming directly from a control console 210 and from computer 13 through control console 210, waveform storage memories 222,225,228,231 for storing waveform data of x-, y-, and z-gradient signals and a modulation signal from write control circuit 221, latches 223,226,229,232 for temporarily storing waveform data outputs from waveform storage memories 222,225,228,231 and D/A converters 224,227,230,233 for converting outputs from latches 223,226,229,232 into analog signals which serve respectively as x-, y-, and z-gradient signal outputs and a modulation signal output. The controller also comprises waveform storage memories 234,236,238,240 for storing data of control signals such as an A/D conversion control signal, a transmission gate control signal, a reception gate control signal, and a phase selection signal (which is a signal for selecting one of four RF pulses of different phases), latches 235, 237, 239, 241 for temporarily storing data outputs from waveform storage memories 234, 236,238,240 and producing an A/D conversion control signal $T_2$, a transmission gate control signal $S_2$, a reception gate control signal $R_2$, and a phase selection signal PS, a readout control circuit 243 for reading stored signals from waveform storage memories 222,225,228,231, 234, 236,238,240 into latches 223,226,229, 232,235,237,239,241, a memory address register 242 for setting write/readout start addresses from the control console or computer (hereinafter referred to simply as "computer"), incrementing the addresses successively with +1 given from the write control circuit 221 and/or readout control circuits 243, and issuing the incremented addresses as write/readout addresses, an output count register 244 for setting a number of output steps given from the computer and applying a signal indicative of an output end to the readout control circuit 243, and a one step length pulse generator 245 for setting the time length (one step long) of one step given from the computer and generating a pulse which is one step long.

The foregoing apparatus operates as follows:

Writing Mode

In the writing mode, waveform data delivered from the computer is written into an address specified in the waveform memory by the computer. More specifically, a write start address is set in the memory address register 242. Data delivered together with a write command from the computer is written in the address specified by the memory address register 242, in the waveform memory (for example waveform memory 222) selected by the write control circuit 221. Thereafter, write control circuit 221 automatically increments the memory address register 242 by 1 to specify a next memory address for data writing. Data items are also written successively into the other waveform memories in the same operation as described hereinbefore.

Readout Mode

Figure 9:
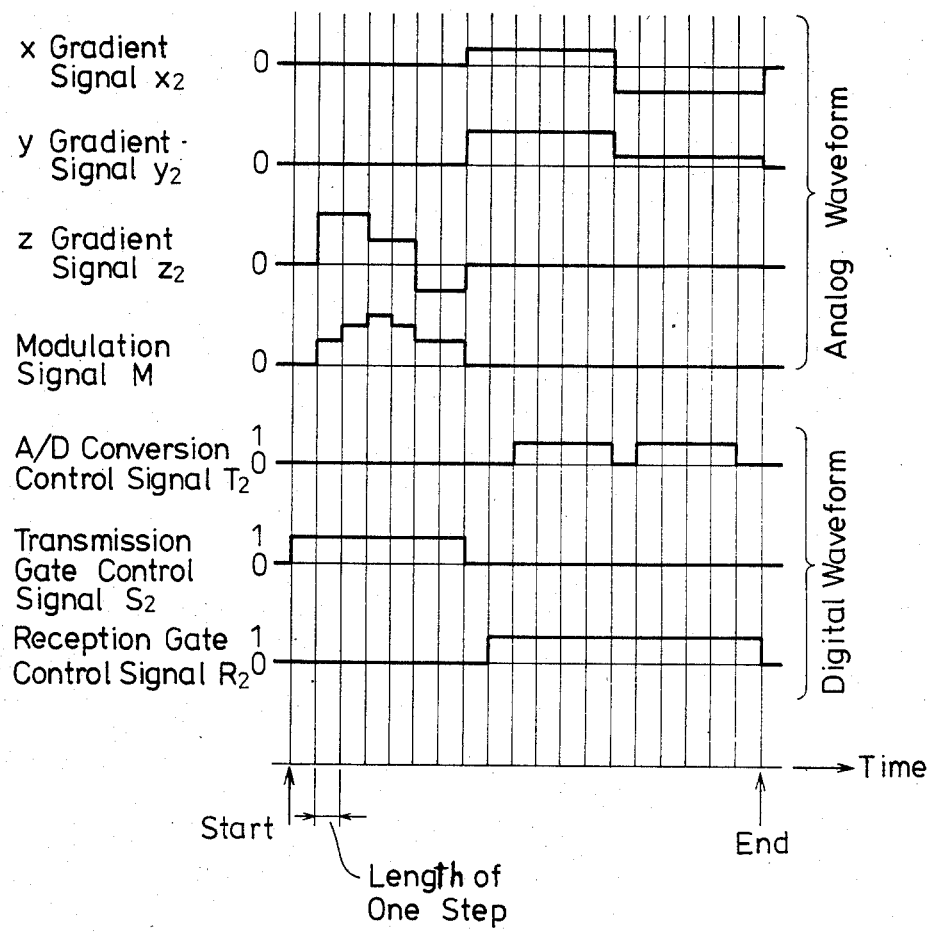
FIG. 9 is a timing chart which explains operation of a controller.

In the readout mode, the memories are read in parallel. FIG. 9 shows a timing chart for signal waveforms as they are read out. The computer sets a readout start address in memory address register 242, sets a readout step number in output count register 244, and also sets a one step length (equivalent to a time per step upon readout) in one step long pulse generator 245. Then, in response to a readout start command from the computer, the stored data items in waveform memories 222,225,228,231,234, 236, 238,240 are simultaneously read out. When all data items are read out, they are latched in latches 223,226, 229,232,235,237, 239,241 in response to a latch pulse applied thereto from readout control circuit 243.

Memory address register 242 is then incremented by 1. If output counter register 244 issues a clear pulse to latches 223,226, 229,232,235, 237, 239,241, to finish the readout operation. If no end signal is issued from output count register 244, then output count register 244 is decremented by 1, and the process goes to a subsequent readout step after having waited for a time interval of one step in response to an output from one step long pulse generator 245.

By repeating the above operation, waveforms, such as shown in FIG. 9, can be read out. The x-, y-, and z-gradient signals $x_2$, $y_2$ and $z_2$ and the modulation signal $M_2$ are analog signals obtained by converting latch outputs with D/A converters 224, 227, 230, 233. Modulation signal $M_2$ is delivered to the gate circuit 30 (FIG. 6), while the x-, y- and z-gradient signals are led to the gradient field control circuit 4.

Since the controller thus constructed has discrete hardware, such as the waveform storage memories, the controller can read a number of data items at high speeds. Because the stored data in the waveform storage memories can be rewritten as desired, any optional analog and digital signal waveforms can be generated. By giving a suitable readout start address and a suitable readout step number, a portion of a signal waveform may easily be used as is the case with many acutal applications.

The gate ciruict 30 is responsive to an RF signal from oscillator 6 for generating four signals which are 90° out of phase with adjacent ones, and selects one of the four signals based on a command from controller 20, and modulates the selected signal with an RF modulation signal to produce a drive signal for exciting coil 5.

Figure 10:
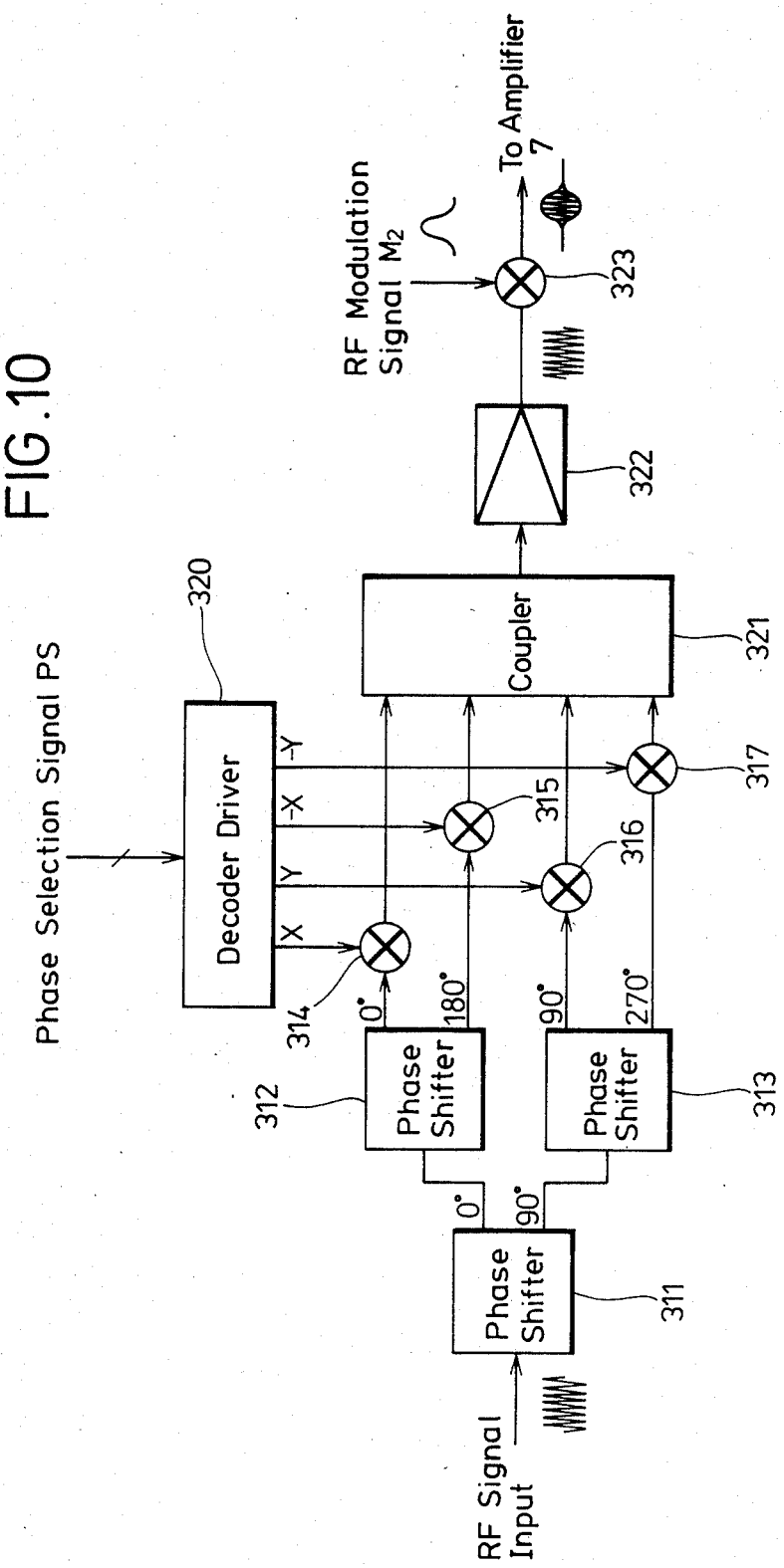
FIG. 10 is a block diagram depicting a gate circuit.

FIG. 10 illustrates gate circuit 30 in greater detail. Gate circuit 10 comprises a 90°-phase shifter 311 for generating two signals which are 0° and 90° out of phase with the RF signal, and 180°-phase shifters 312,313 each for generating two signals which are 0° and 180°, out of phase with an applied signal. By applying the two outputs from the 90°- phase shifter 311 to the 180°-phase shifters 312,313, the 180°-phase shifters 312,313 produce signals which are 0°, 90°, 180°, and 270° out of phase with the RF signal. These four signals are delivered through high frequency switches (e.g. double balanced mixers, also called "DBM") 314, 315,316 and 317 to a coupler 321 which combines the four signals. The high frequency switches 314–317 are independently energizable by four outputs from a decoder driver 320. The four outputs (X, Y, −X, −Y) are generated from decoder driver 320 by decoding a phase selection signal PS given by controller 20. Only one of the four outputs is activated at a time to render a corresponding high frequency switch conductive while the other three high frequency switches remain non-conductive. Therefore, only one output signal is applied to coupler 321.

Figure 4:
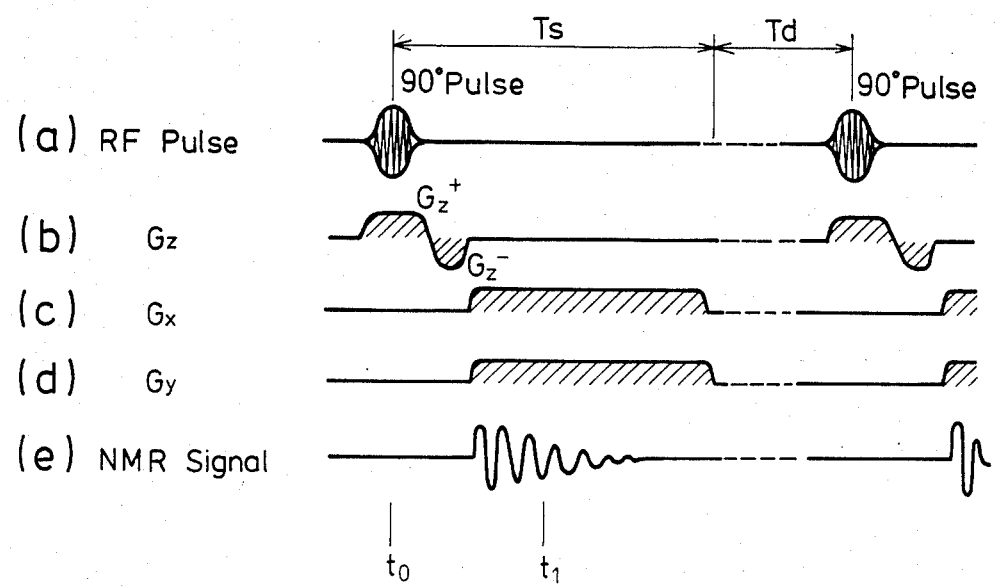
FIG. 4 is a diagram depicting the waveforms of pulse signals applied for NMR examination.
Figure 5:
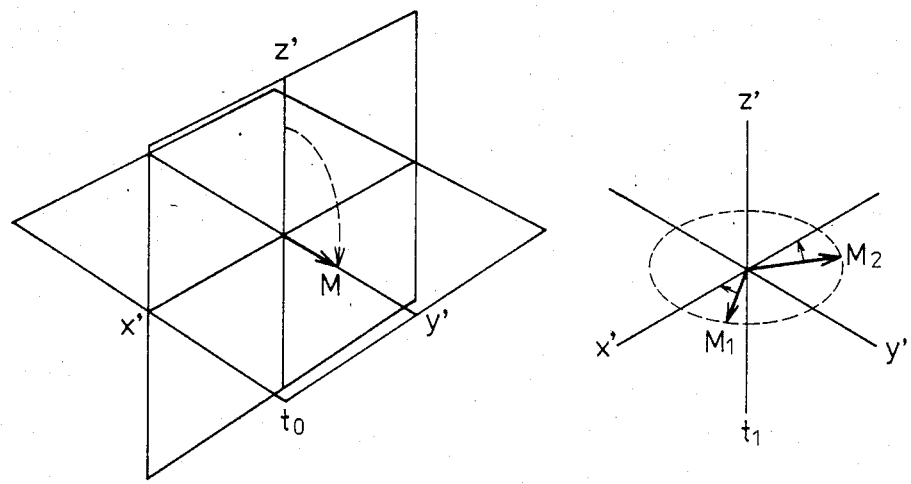
FIGS. 5(a) and 5(b) are diagrams depicting magnetization M on a rotating coordinate system.

An output from coupler 321 is applied via an amplifier 322 to a modulator 323 which modulates an output from the amplifier 322 with the RF modulation signal (its pulse duration and peak value determines the angle of rotation of magnetization M) into a modulated output having a waveform as shown at FIG. 4, line (a).

The gate circuit 30 thus constructed produces RF signals having phase differences of 0°, 90°, 180°, and 270° from one RF signal, selects one of the produced signals, and modulates the selected signal with a desired waveform at suitable timing.

Operation of Apparatus

The operation of the inventive apparatus will now be described with reference to FIG. 11.

(1) A current is passed from controlcircuit 2 through static field coil 1 to apply a static field $H_0$ to an object body placed in a cylindrical body comprising coil 1. Controller 20 controls control circuit 4 to pass a current through the gradient field coil (here the gradient field coil is for the z-gradient field) 31 for producing a first gradient field, that is, a z-gradient field $Gz^+$ as shown in FIG. 11, line (b).

Figure 11:
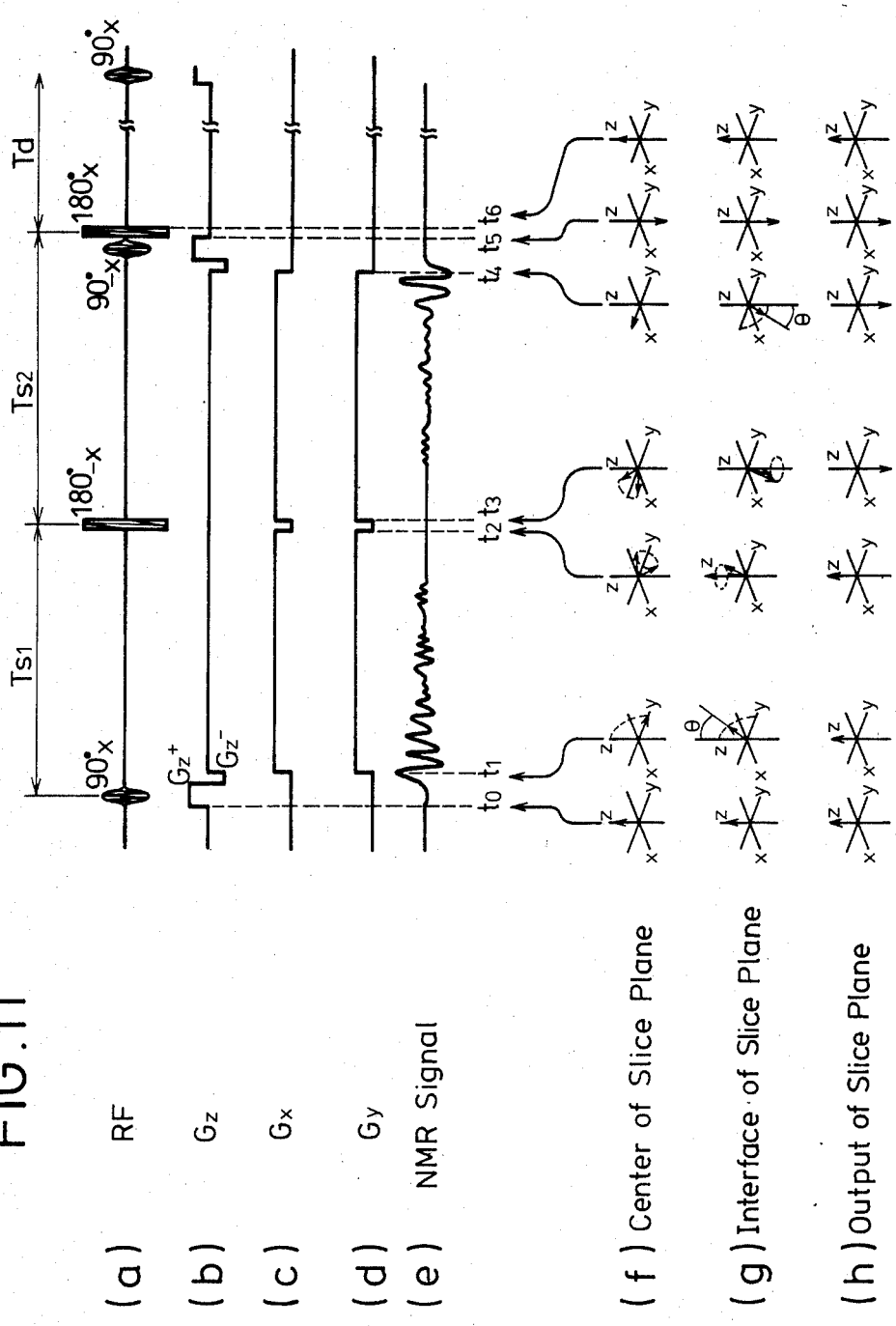
FIG. 11 is a diagram depicting signal waveforms and magnetization vectors to explain a sequence of the invention.

At this time $t_0$, the directions of magnetization M in the center of a slice plane (an area in which the magnetization M properly rotates 90° upon application of a 90° pulse), at the interface of a slice plane (an area in which the magnetization M rotates $\theta$° upon application of a 90° pulse and rotates 180° upon application of a 180° pulse since Gz=0), and outside of a slice plane (an area in which the magnetization M is not affected by application of a 90° pulse and reverses its direction upon application of a 180° pulse) are all equal to a positive direction (upward) along the Z axis as shown in FIG. 11, lines (f), (g) and (h).

(2) Under the field Gz+, a plane (slice plane) of the object body is excited by an RF signal (a 90°$_x$ pulse as shown in FIG. 11, line (a) produced by modulating the signal of the phase 0° selected and issued by gate circuit 30 into a prescribed form (e.g. Gaussian shape). Then, from time $t_1$ on, the x- and y-gradient field coils 32, 33 are energized to apply a second gradient field (comprised of x- and y-gradient fields Gx, Gy) of a prescribed magnitude as shown in FIG. 11, lines (c) and (d).

A waveform signal Gz$^-$ following Gz$^+$ shown in FIG. 11 line (b) serves to bring NMR resonance signals from different regions of the object body into phase, and is well known in the art.

At the time $t_1$ when the magnetic fields Gx, Gy are applied, the magnetizations M are directed as shown in FIG. 11, lines (f), (g) and (h).

After the time $t_1$, a first NMR signal (called an "FID" signal) as shown in FIG. 11, line (e) is detected by detector coil 8 and led through amplifier 9 to phase detector 10. The phase detected signal is then stored in wave memory 11. The stored data is read at suitable timing by computer 13, and subjected to a Fourier transform, whereby the data is converted into a one projection signal.

(3) At a time $t_2$ upon elapse of a time period $T_{s1}$ in which FID signal is eliminated after time $t_1$, the x- and y-gradient field coils are de-energized, and the object body is excited by an RF signal produced by modulating the signal having the phase of 180° selected and issued by gate circuit 30 into a rectangular waveform. That is, a 180°$_{-x}$ pulse is applied entirely to the object body as shown in FIG. 11, line (a).

(4) After the 180°$_{-x}$ pulse has been applied, a second gradient field, or the gradient fields Gx, Gy, which has the same magnitude as before is applied. At this time $t_3$, the magnetization M is rotated as shown in FIG. 11, lines(f), (g) and (h).

After time $t_3$, scattered magnetizations M start to be brought together, and detector coil 8 detects a second NMR signal (called an "echo signal") as shown in FIG. 11, line (e). The echo signal has a signal waveform such that first and second NMR signals are symmetric in shape with respect to central times $t_2$, $t_3$ provided fields Gx, Gy applied before time $t_2$ and after time $t_3$ are the same and the condition of the object body remains unchanged during that time interval.

(5) Upon elapse of a time $(t_2-t_1)$ from time $t_3$, the application of fields Gx, Gy is interrupted by controller 20. At this time $t_4$ magnetization M is directed as shown in FIG. 11, lines (f), (g), and (h).

After time $t_4$, Gz$^-$, Gz$^+$ are applied, and under these fields a 90°$_{-x}$ pulse is applied to the object body with an RF signal modulated with the phase 180° in gate circuit 30 in the same manner as with the first 90° pulse to excite the slice plane again which has been excited by the first 90° pulse. At time $t_5$, when the excitation ends, the directions of the magnetizations M are all aligned to the direction of −Z outside of the slice plane and at the interface of the slice plane, that is, in all regions of the object body (see FIG. 11, lines (f), (g), (h)).

(6) After the application of Gz$^+$ has been interrupted, the object body is excited by an RF signal produced by modulating the signal of the phase 0° into a rectangular waveform with gate circuit 30 (180°-pulse excitation) (See line (a)). At time $t_6$, when this excitation is completed, the magnetizations M are all oriented in the direction of +Z upon application of the 180° pulse. (See lines (f), (g) and (h)).

The term "immediately" or "substantially immediately" is used herein to specify the time between termination of the second 90° pulse and the application of the second 180° pulse, as shown, for example, in FIG. 11, line (a). What is intended for coverage thereby is that time spacing between the two pulses should be such that the magnetizations resulting from the second 90° pulse (e.g. −Z direction) is substantially completed and thereupon substantially reversed by the second 180° pulse (e.g. +Z direction). The time can be as close as physically possible to produce such effect. The 180° pulse can be applied, alternatively, at a later time; however, the object is to reduce the wait time Td and hence the second 180° pulse should be applied as soon as possible after termination of the second 90° pulse, and at least within a time span shorter than $t_{s1}$ or $t_{s2}$, as shown in FIG. 11, line (a).

Therefore, the process returns at time $t_6$ to the condition existing at time $t_0$. With the above system, however, spinspin relaxation or transverse relaxation that the material has remains, and the magnetizations M are not completely directed upwardly at time $t_6$. Thus, a wait time Td is provided after time $t_6$ to wait until the magnetizations M are fully directed upwardly, whereupon one sequence is finished and following sequences are repeated.

Figure 12:
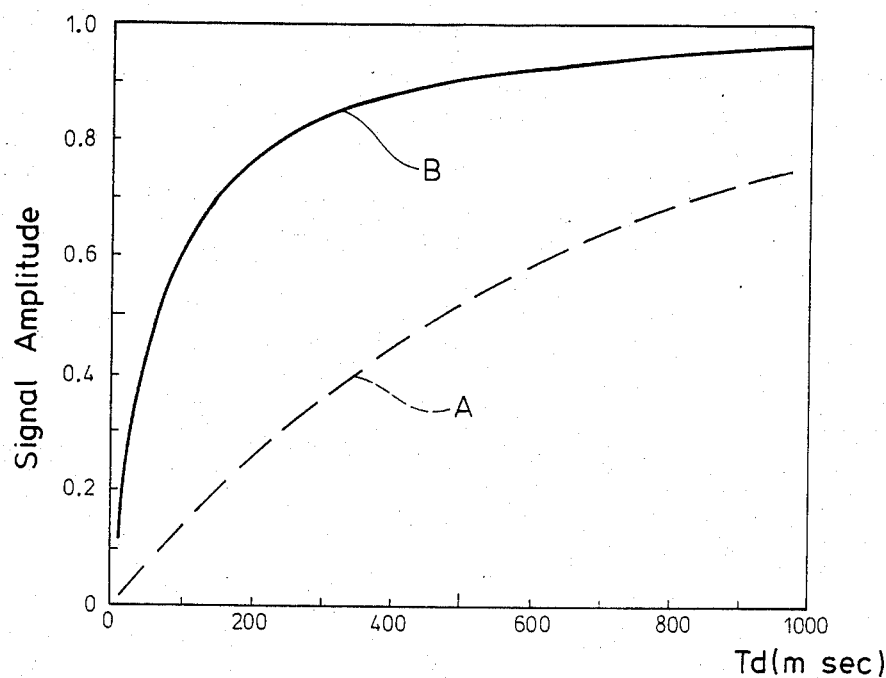
FIG. 12 is a diagram depicting the relationship between wait time and signal intensity.

With such a sequence, the wait time Td is much shorter than the conventional wait time. FIG. 12 shows how the wait time of the invention is shorter than the conventional prior art wait time. The curves were plotted under conditions in which the white of an egg (longitudinal relaxation time $T_1$=693 mS, transverse relaxation time $T_2$=262 mS) is used as the object, and $T_{s1}+T_{s2}$=30 mS. The graph has a horizontal axis indicative of the wait time Td and a vertical axis indicative of a signal amplitude after a balanced condition has been reached. The dash line curve A represents prior art measured values (equal to theoretical values), and the solid curve B represents measured values (equal to theoretical values) as produced by the invention. FIG. 12 clearly shows that the same signal intensity or amplitude can be obtained in a much shorter time (Td) according to the invention.

Since the process can be shifted into a next sequence with a much smaller wait time than the conventional wait time, the time period required to scan all views can be substantially reduced.

The process for reconstructing an image based on the sequence of the above embodiment is preferably by a so-called two dimensional projection reconstruction process.

While in the above embodiment RF pulses of 90°$_x$−180°$_{-x}$−90°$_{-x}$180° are applied in one sequence, advantageously, the magnetizations M are all directed downwardly with a second 90°-pulse (see FIG. 11, lines (f),(g) and (h)) and then are all directed upwardly with a second 180°-pulse. Also, other various phase relations may be employed, such as the sequence of applied pulses of 90°$_x$−180°$_y$−90°$_x$180°$_{-x}$ (180° RF pulse is produce by using the RF signal of the phase 90°). Such an alternative can be applied to the following methods.

The invention is not limited to the above embodiments, and may also be applied to the following and other similar methods or processes.

(1) Either the first NMR signal (FID signal) or the second NMR signal (echo signal) may be used, and subjected to a Fourier transform. With the resultant signal used as one projection data, an image is reconstructed.

(2) The first NMR signal (FID signal) and the second NMR signal (echo signal) are averaged to improve the S/N (signal to noise ) ratio, and the resultant signal is used to reconstruct an image. The FID signal and the echo signal should be averaged, taking into consideration the fact that they are symmetrical with respect to the central times $t_2$, $t_3$. With respect to the RF pulse sequence of $90°_x - 180°_{-x} - 90°_{-x} 180°_x$, the FID signal and the echo signal are 180° out of phase with each other, and hence should be averaged taking that fact into consideration.

(3) Images are obtained separately from the first NMR signal (FID signal) and the second NMR signal (echo signal) and an image is generated in $T_2$(spin-spin relaxation time) by effecting an arithmetic operation between the two images. Since the echo signal undergoes relaxation with the time constant of $T_2$ as compated with the FID signal a $T_2$ image can be produced from the images based on the respective signals.

Figure 13:
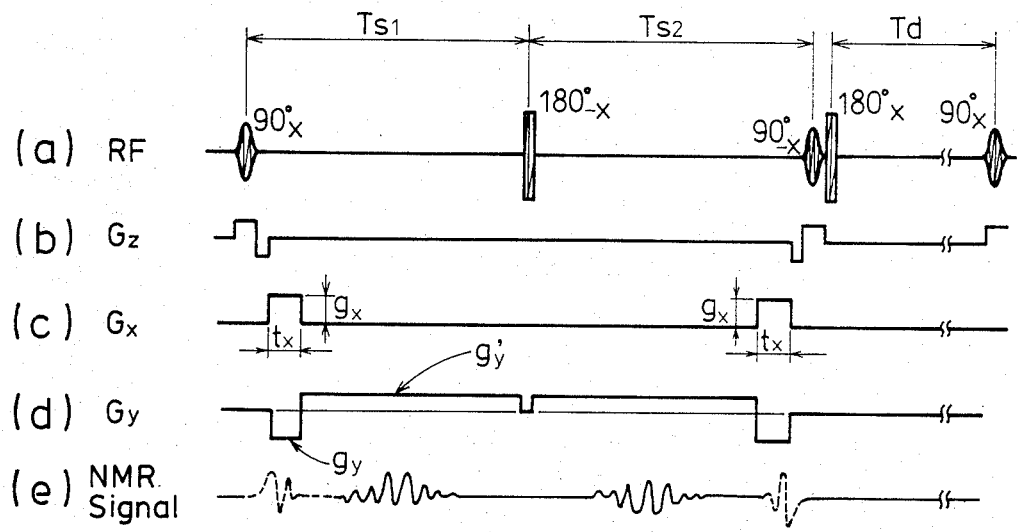

(4) The pulse sequence of the invention can be used for a spin-warp process in which gradient fields Gx,Gy, Gz are applied as shown in FIG. 13. More specifically, means for applying a gradient field is energized during the period $T_{s1}$ for applying a second gradient field (e.g. Gx) in a direction (e.g. perpendicularly to) different from that of a first gradient field (e.g. Gz) to give a phase variation. The means is energized for applying a third gradient field (e.g. Gy) in a direction different from those of the first and second gradient fields Gz, Gx, with the third gradient field being switched between gy,gy' of different polarities. The fields are applied in period $T_{s2}$ in the same direction as those of the second and third gradient fields Gx,Gy in period $T_{s1}$. The intensity or time of application or both, of second gradient field Gx are varied at least in each sequence. An image is produced through a two dimensional Fourier transform based on a generated NMR signal (which is observed as a spin echo rather than an FID signal).

The intensity of each gradient field can be varied so that period $T_{s1}$ or $T_{s2}$ will be shorter than the other while maintaining the integral of the intensity of gradient field in periods $T_{s1}$, $T_{s2}$ with respect to time. The result is that the scanning time can further be reduced. Any spin echo signal generated in the shortened period is skipped and only spin echo signals generated in other periods is observed.

Figure 14:
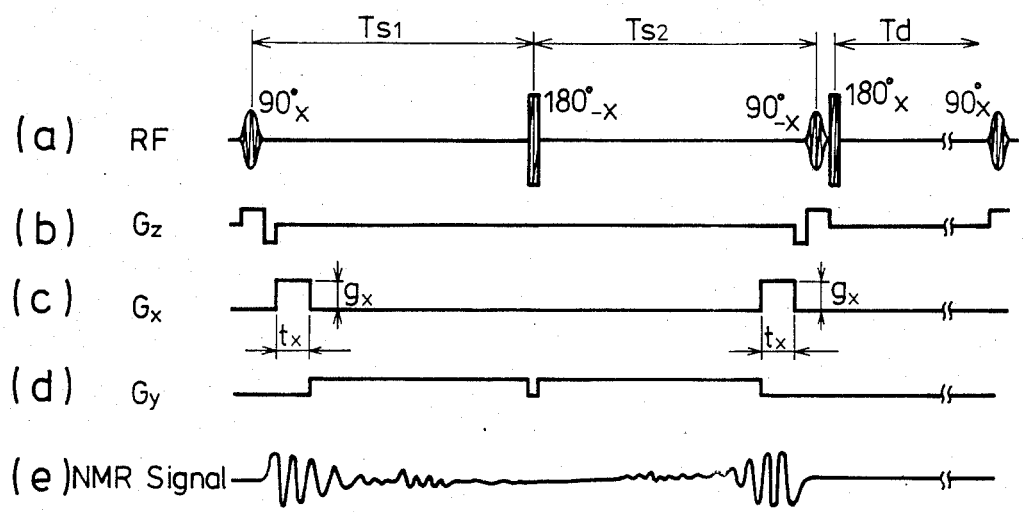

(5) The invention may be applied to a so-called two dimensional Fourier process in which gradient fields Gx, Gy, Gz are applied as shown in FIG. 14. More specifically, means for applying a gradient field is energized during period $T_{s1}$ for applying a second gradient field in a direction (e.g. perpendicularly to) different from that of a first gradient field to give a phase variation. The means is energized for appying a third gradient field in a direction (e.g. perpendicularly to) different from those of the first and second gradient fields. The fields are applied in period $T_{s2}$ in the same direction as those of second and third gradient fields in period $T_{s1}$. The intensity and time of application of second gradient field Gx are of values required for imaging. An image is produced through a two dimensional Fourier transform based on a generated NMR signal.

Figure 15:
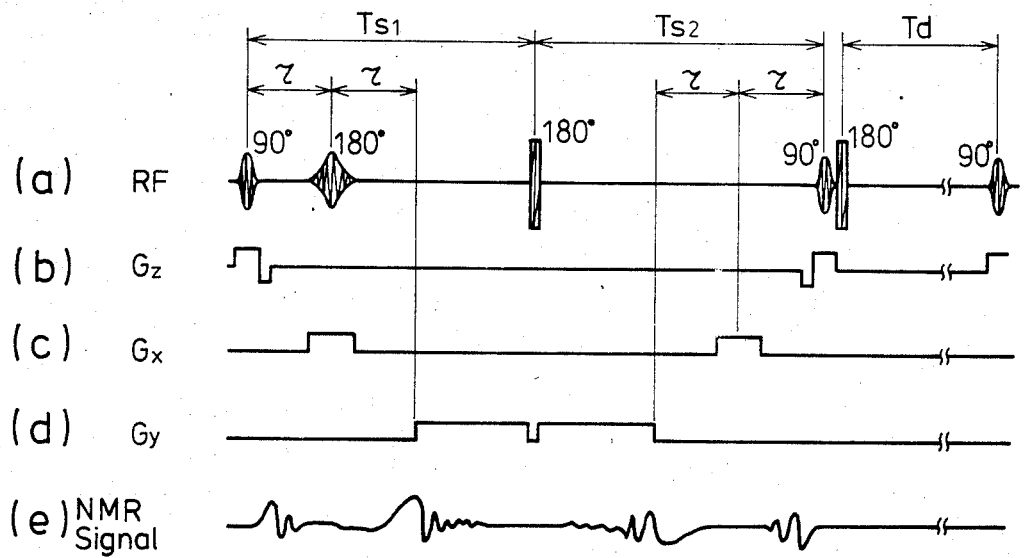

(6) The invention is applicable to a so-called selective excitation line method in which gradient fields Gx,Gy,Gz and RF pulse excitation as shown in FIG. 15 are used.

Figure 16:
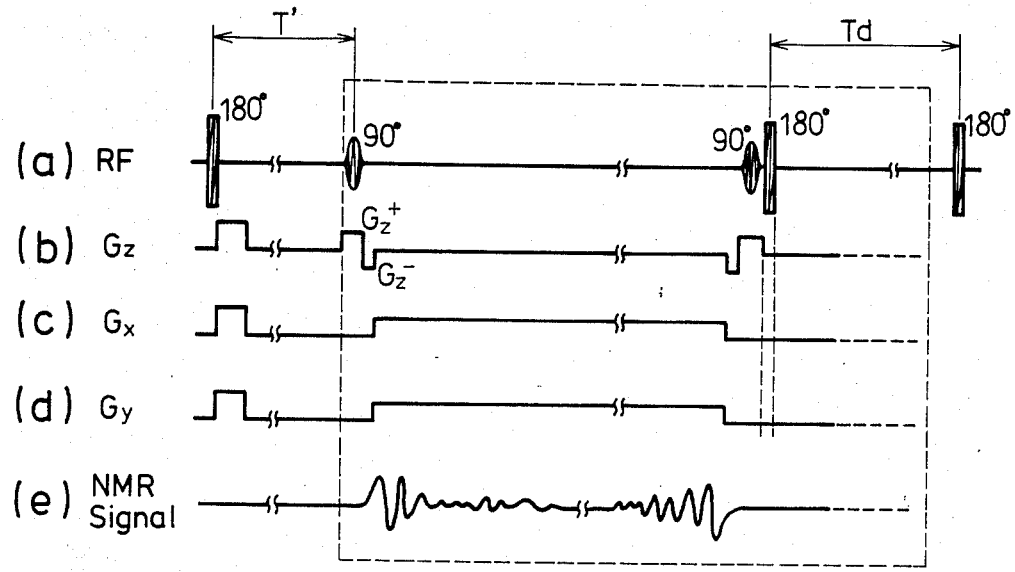

(7) As shown in FIG. 16, the steps of the sequence (shown within the dotted lines, the PR process being illustrated for example) inversion recovery may be added to each of the foregoing PR process (FIG. 11) and the methods described above as alternatives (1) and (2). In each method, the object body is excited by a 180° pulse modulated in a rectangular waveform a suitable time T' prior to the 90°-pulse excitation. After the 180° pulse is applied, a homogeneity spoil pulse is applied to Gx,Gy,Gz for preventing any adverse effects in the transverse direction which would be caused by any inaccuracy of the 180° pulse (see left end of lines (a),(b),(c) (d)). The application of such a homogeneity spoil pulse may not necessarily be required, and it may be omitted if adverse effects are not produced or are negligible in the transverse direction. While the applied 180° pulse has been described as not accompanying a gradient field for selective excitation, that is, such as for non-selective excitation, selective-excitation may be employed in which a gradient field is simultaneously applied with a 180° pulse of a narrow frequency spectrum.

Figure 17:
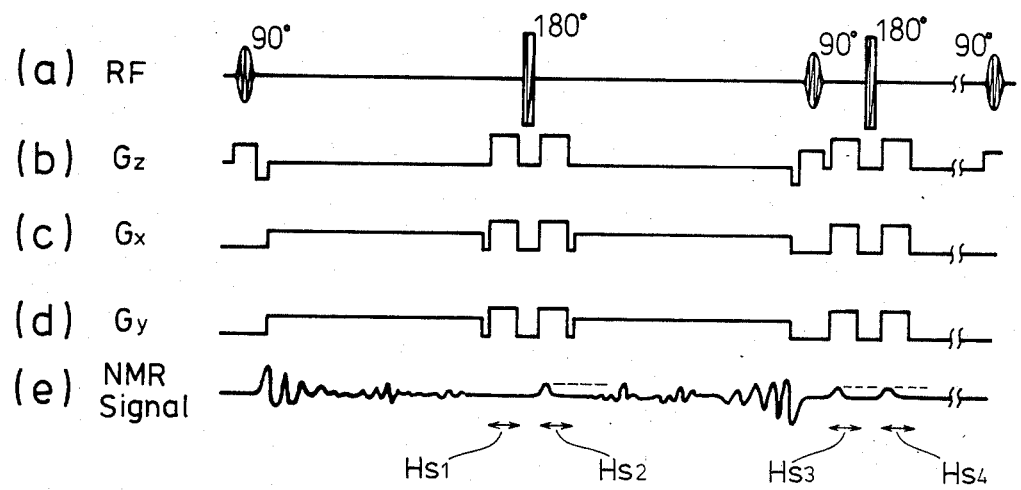

(8) To prevent excessive signals from being generated due to an error in the magnitude of an excitation pulse, homogeneity spoil pulses may be added in periods $H_{s1}$ through $H_{s4}$ in the sequence shown in FIG. 17.

In FIG. 17, where the first 180° pulse is inaccurate, a transverse component of magnetization vector is produced and serves as a noise signal. Thus, a homogeneity spoil pulse is applied (for all Gx, Gy, Gz) in the period $H_{s2}$ immediately after the first 180° pulse (see about midpoint of lines (b)(c)(d)) to eliminate the transverse component of magnetization vector. If it were not for the homogeneity spoil pulse, the NMR signal would be as indicated by the dotted lines in FIG. 17, line (e). Since only the above homogeneity spoil pulse still allows the magnetization vector to be disturbed in motion, another homogeneity pulse having the same magnitude and time duration as those of the foregoiing homogeneity spoil pulse is applied immediately prior to the application of the first 180° pulse (for. all Gx,Gy,Gz). The time periods $H_{s2}$, $H_{s1}$ are used in pairs at all times.

For eliminating a transverse component of magnetization vector due to any inaccuracy of the 90° pulse or other causes, a homogeneity spoil pulse is applied for periods $H_{s3}$ after the pulse (see toward right end of lines (a), (b), (c), (d)).

For eliminating a transverse component of magnetization vector due to an inaccuracy of the 180° pulse and other causes, and for breaking the correlationship between views for proper observation, a homogeneity spoil pulse is applied for period $H_{s4}$ after the second 180° pulse.(see toward right end of lines (b),(c),(d) )

The homogeneity spoil pulses in the time periods $H_{s1}$, $H_{s2}$ and $H_{s4}$ need not be in the illustrated combination. Any one or any two or more of them may be used in combination.

Figure 18:
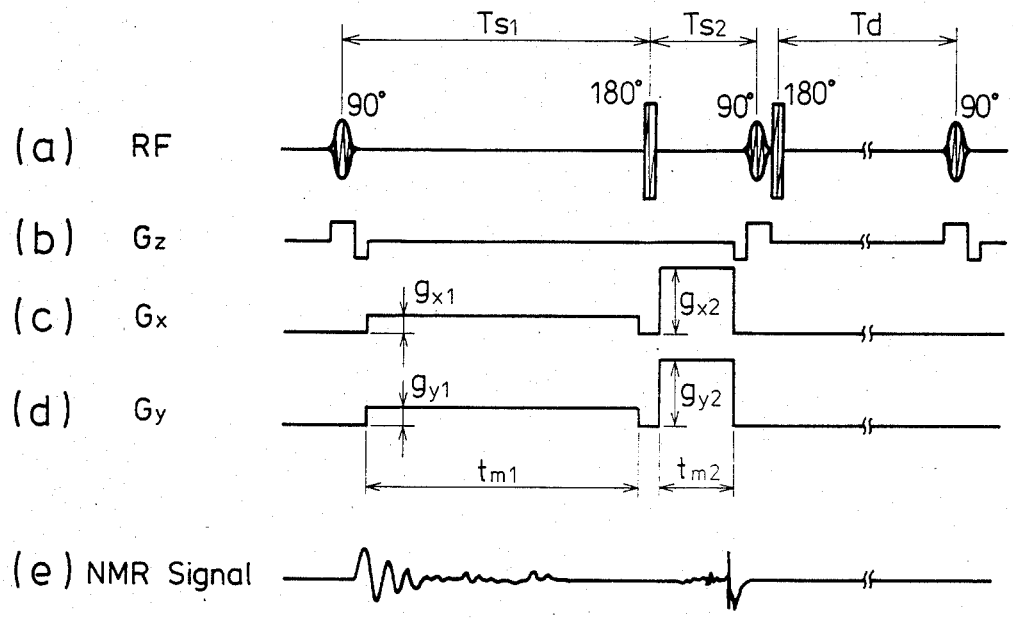

(9) Time periods $T_{s1}$ or $T_{s2}$ may be shortened. FIG. 18 shows an example wherein time period $T_{s2}$ is reduced. In such an example, the following relationships are required to be met:

$$g_{x1} \cdot t_{m1} = g_{x2} \cdot t_{m2} \tag{4}$$

$$g_{y1} \cdot t_{m1} = g_{y2} \cdot t_{m2} \tag{5}$$

wherein $t_{m1}$, $t_{m2}$ are the times of application of gradient fields.
$g_{x1}$, $g_{x2}$ are the intensity of Gx gradient fields.
$g_{y1}$, $g_{y2}$ are the intensity of Gy gradient fields.

By shortening $T_{s2}$, any adverse effect of the value $T_2$ which the material has (the magnetization vector is subjected to transverse relaxation due to $T_2$) may be reduced.

(10) Using the sequence shown in FIG. 11, at least one of the times $T_{s1}$, $T_{s2}$, and Td may be varied to produce a plurality of images. An arithmetic operation is effected among the images to generate a $T_1$ image, a $T_2$ image, a spin density image, or an image which is a combination of these images.

For example, the intensity V of the FID signal in the sequence of FIG. 11 meets the following relationship.

$$V \alpha M \frac{1 - \exp\left(-\frac{Td}{T_1}\right)}{1 - \exp\left(-\frac{Td}{T_1} - \frac{T_{s1} + T_{s2}}{T_2}\right)} \tag{6}$$

wherein M is the spin density.

The arithmetic operation is effected among the plurality of images obtained by changing $T_{s1}$, $T_{s2}$, Td.

(11) The invention is applicable to a multi-slice process in which other planes are excited using the wait time of Td for obtaining information on the excited planes.

Figure 19:
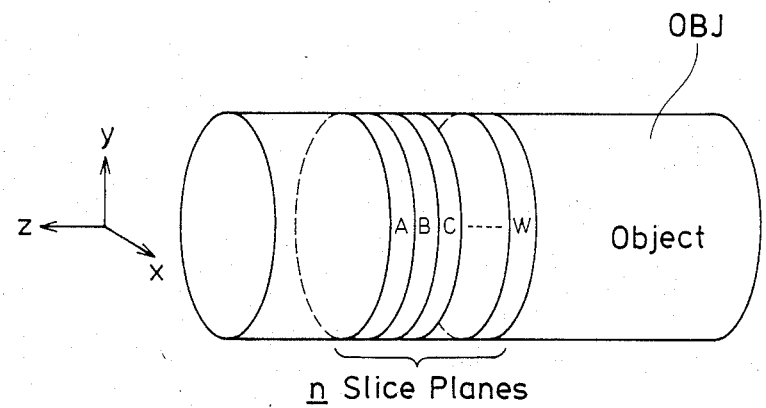
FIG. 19 is a diagram which explains a multi-slice method.
Figure 20:
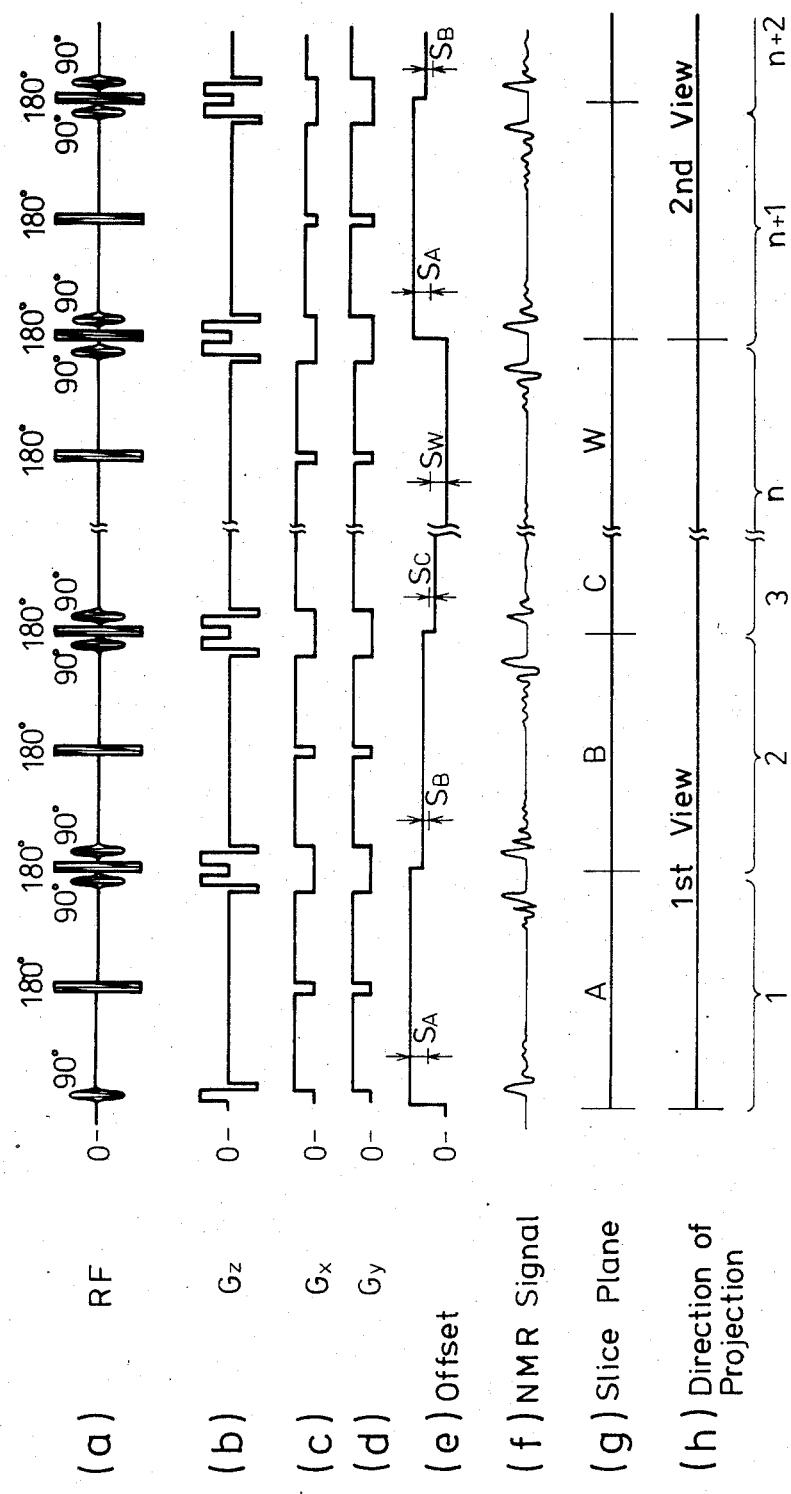

FIG. 20 shows such a sequence in which the invention is applied to the two dimensional PR process. In each view n slice planes are excited. As shown in FIG. 19, n slice planes A through W of an object OBJ are excited for a first view, and n slice planes are excited at a different view angle for a second view. With this arrangement, apparent operation speed can be increased.

Figure 21:
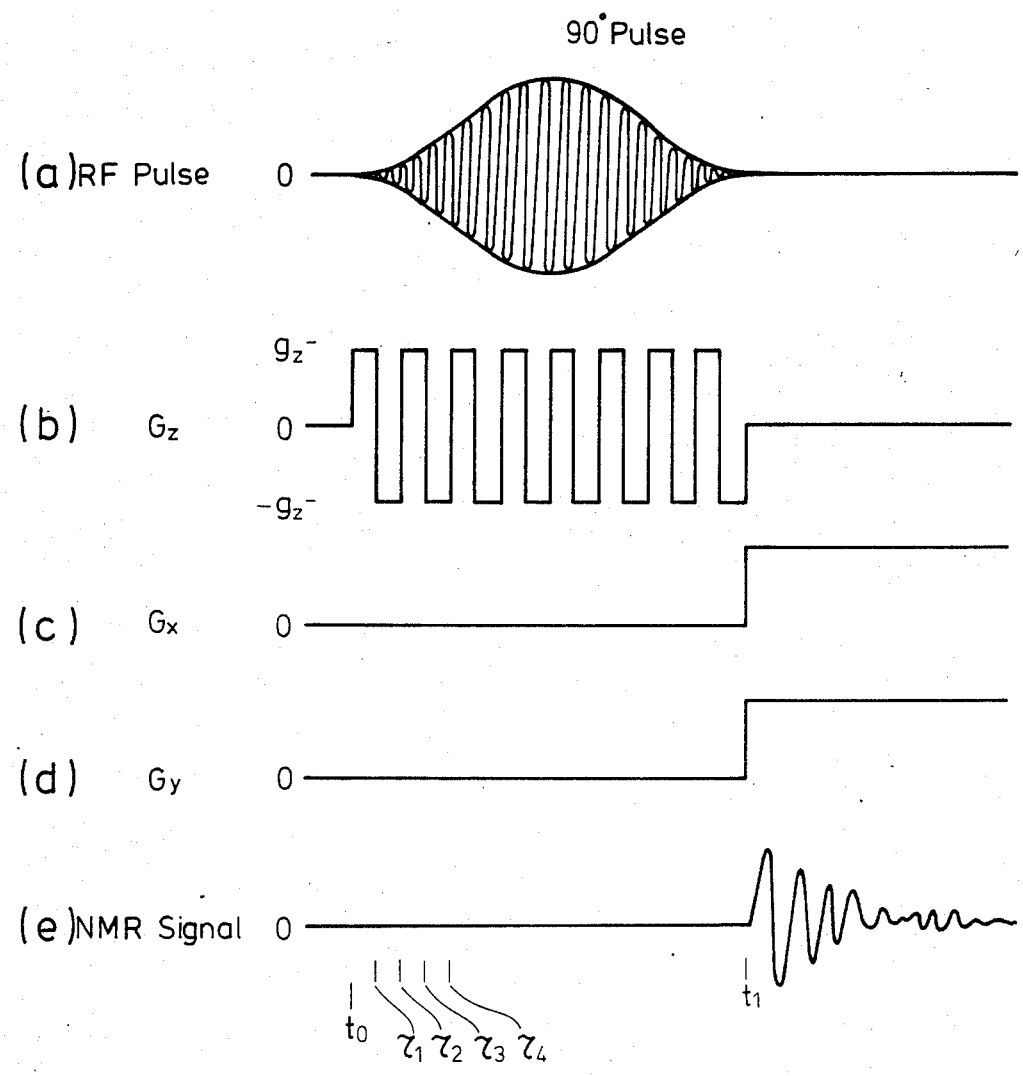

(12) The Gz gradient field applied in response to the 90° pulse is oscillated between positive and negative values at high speed as shown in FIG. 21 for producing a gradient field having a square waveform.

Since the magnetization vector is not disturbed (or not out of phase in the direction of Z), no rephase is necessary, and the FID signal can be observed immediately after the 90° pulse has been imposed.

(13) Each of the 90° pulse and the 180° pulse may comprise a plurality of pulses.

Figure 22:
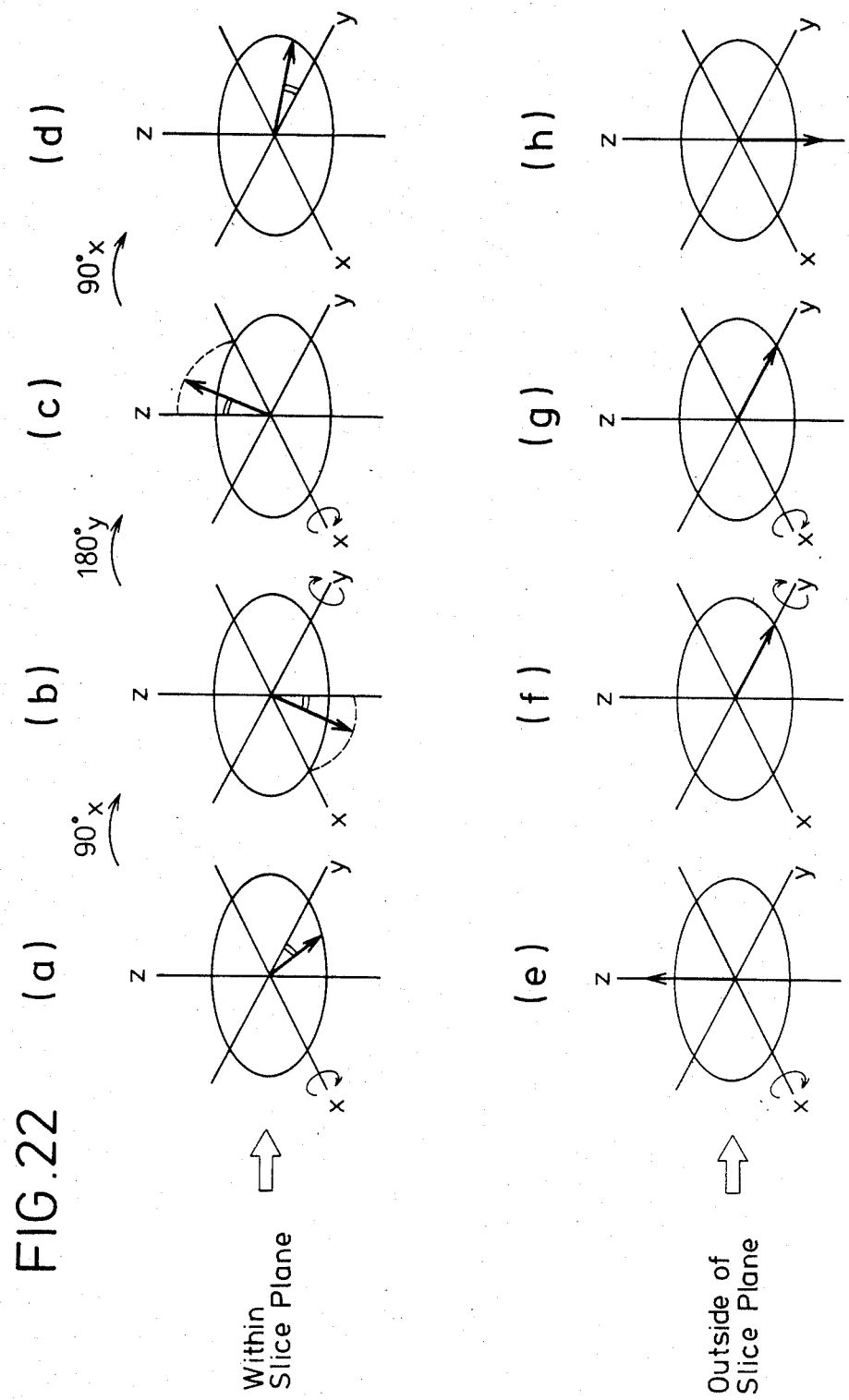
FIGS. 22(a), 22(b), 22(c), 22(d), 22(e), 22(f), 22(g) and 22(h) are diagrams depicting the manner in which magnetization vector is moved upon application of 90° pulse, 180° pulse, and 90° pulse, instead of all 180° pulses.
Figure 23:
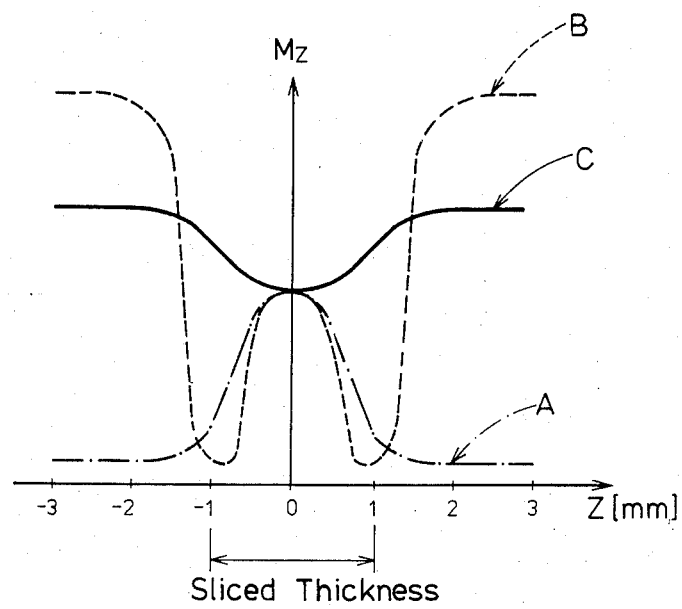
FIG. 23 is a diagram depicting the computerized results of successive execution of pulse sequences and when dynamic balanced condition is reached.
Figure 24:
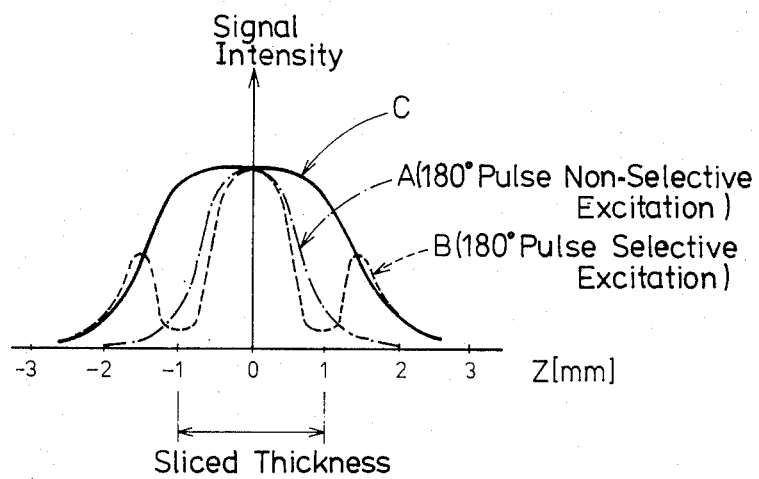
FIG. 24 is a diagram depicting an NMR signal intensity after a first 90°-pulse and a z-gradient field have been applied to Mz of FIG. 23 for selective excitation.

For example, the $180°_{-x}$ pulse may be replaced with a combination of three $90°_y$, $180°_{-x}$, and $90°$ pulses, or with a combination of three $90°_{-y}$, $180°_{-x}$, and $90°_{-y}$ pulses. The $180°_y$ pulse may be replaced with a combination of three $90°_{-x}$, $180°_y$, and $90°_{-x}$ pulses. FIG. 22 illustrates the directions of magnetization vectors in which the 180° y pulse is replaced with a combination of three $90°_x$, $180°_y$, and $90°_x$ pulses. FIG. 22(a) through FIG. 22(d) show vectors within a slice plane. FIG. 22(e) through FIGS. 22(h) show vectors outside of a slice plane. As can be understood from FIGS. 22(a) through 22(h), since the longitudinal component rotates accurately, the movement of the magnetization vector outside of the slice plane can be rendered correct.

The magnetization vector may be rotated accurately by using four $45°_{-y}$, $90°_x$, $90°_y$, $45°_x$ instead of the $90°_x$ pulse.

Figure 25:
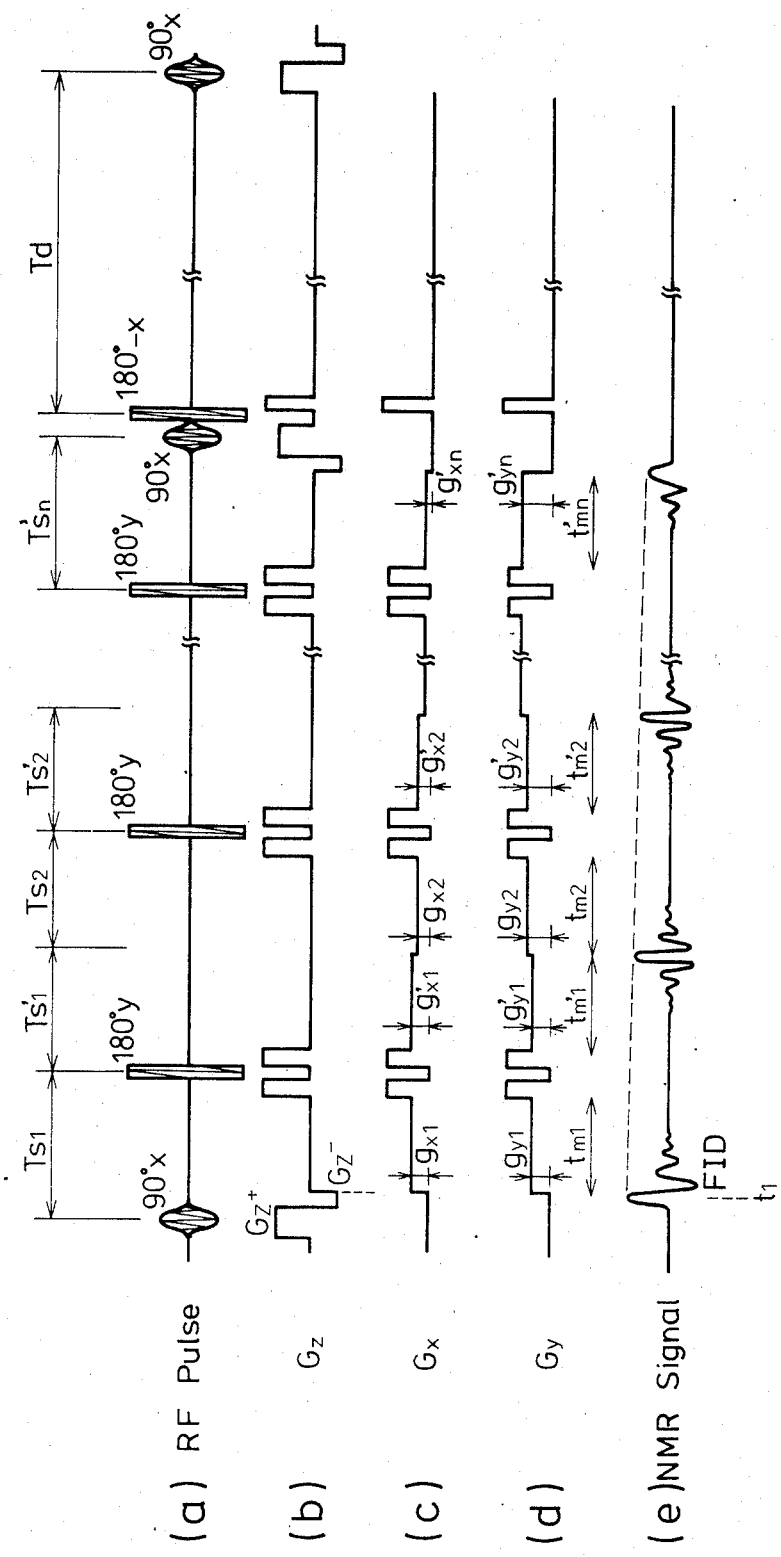

FIG. 25 is illustrative of another embodiment utilizing a sequence of the invention. In this sequence, a plurality of 180° pulse are applied at certain time intervals between the first 90° pulse and the second 90° pulse.

Process of Invention

The process will now be described more specifically with particular reference to FIGS. 6, 7(a), 7(b) and 25.

(1) A current is passed by control circuit 2 through static field coil 1 to apply a static field $H_0$ to an object body (placed in the cylinder of the coils). Under this condition, z-gradient field coil 31 is supplied with a current through control circuit 4 from controller 20 to apply a first gradient field (e.g. z-gradient field), to thereby apply z-gradient field $Gz^+$ as shown in FIG. 25, line (b). At the same time, a first 90° pulse is applied as shown in FIG. 25, line (a) for selectively exciting the object body.

(2) Then, as shown in lines (b) and (c), a gradient field $Gz^-$ is applied, following the application of $Gz^+$, to bring NMR signals from different regions of the object body into phase. The application of $Gz^-$ is finished at a time $t_1$.

(3) Thereafter, as shown in lines (c) and (d), a second gradient field (comprising gradient fields Gx, Gy having respective magnitudes $g_{x1}$, $g_{y1}$) in a direction different from that of the first gradient field is applied for a time $t_{m1}$.

(4) Upon elapse of a time $T_{s1}$, as shown in line (c), after the application of the first 90° pulse, the object body is excited by an RF pulse produced by modulating the signal of the phase 180°, selected and supplied by gate circuit 30, into a rectangular-waveform.

Before and after the $180°_y$ pulse, homogeneity spoil pulses are applied for Gx, Gy, and Gz, as shown in FIG. 25, lines (b) through (d) to suppress noise which would be generated by any inaccuracy of the 180° pulse.

The suffixes x, y to 90°, 180° are indicative of the phase of the RF pulses, and the x and y are 90° out of phase with each other.

(4) The, Gx and Gy (see lines (c) and (d)) are selected to be $g'_{x1}$ and $g'_{y1}$, respectively, to thereby produce a spin echo signal as illustrated in line (e).

The echo signal is at maximum when $$g_{x1} \times t_{m1} = g'_{x1} \times t'_{m1} \tag{7}$$

$$g_{y1} \times t_{m1} = g'_{y1} \times t'_{m1} \tag{8}$$

(5) then, Gx and Gy (see lines (c) and (d)) are changed to $g_{x2}$ and $g_{y2'}$, respectively, and above steps (2) through (4) are repeated. At this time, it is necessary to meet the following equations.

$$g_{xp} \times t_{mp} = g'_{xp} \times t'_{mp} \tag{9}$$

$$g_{yp} \times t_{mp} = t'_{yp} \times t'_{mp} \tag{10}$$

The suffix $p = 1, 2, \ldots, n$ and is indicative of the number of 180° pulses between the first 90° pulse and the second 90° pulse (described hereinbelow in greater detail). As required the following relationships are met $$g_{xp} = g'_x(p-1) \tag{11}$$

$$g_{yp} = g'_y(p-1) \tag{12}$$

not to change the magnitude of the gradient fields at the peak of the echo signal. This can avoid noise due to switching between the gradient fields resulting in a good image quality.

(6) After a prescribed number n of 180° pulses have been applied, the magnetization vector is directed selectively with the 90° pulse and Gz into a negative direction (downwardly) along the z axis when n is an odd number and a positive direction (upwardly) along the z axis when n is an even number, at the timing when the echo signal is maximum. (i.e. when $t'_{mn}$ is finished).

(7) Only when n is an odd number, all magnetization vectors are directed upwardly with the $180°_{-x}$ pulse.

(8) Thereafter, homogeneity spoil pulses are applied for Gx, Gy and Gz to eliminate the correlationship between the present sequence and the next sequence.

(9) The same sequence will be repeated after having waited for the time Td.

In the above sequence, the time parameters Tsp, T'sp, and Td and n are appropriately selected to suit particular conditions of use.

Figure 26:
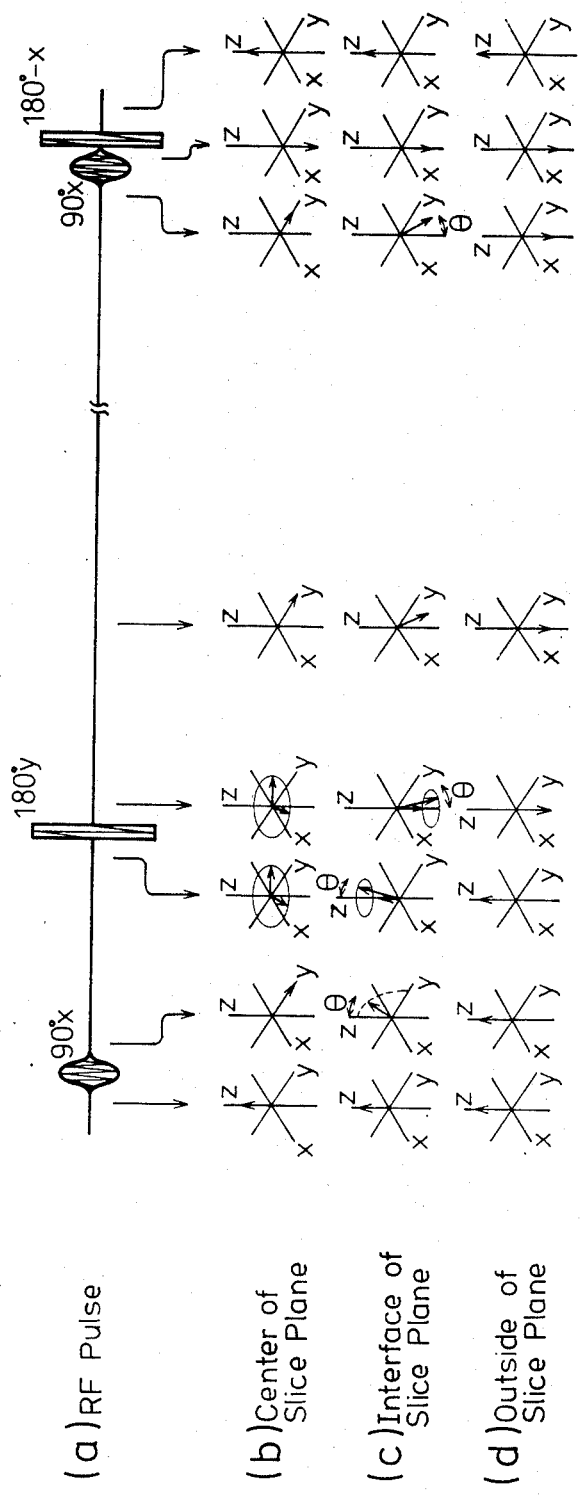
Figure 27:
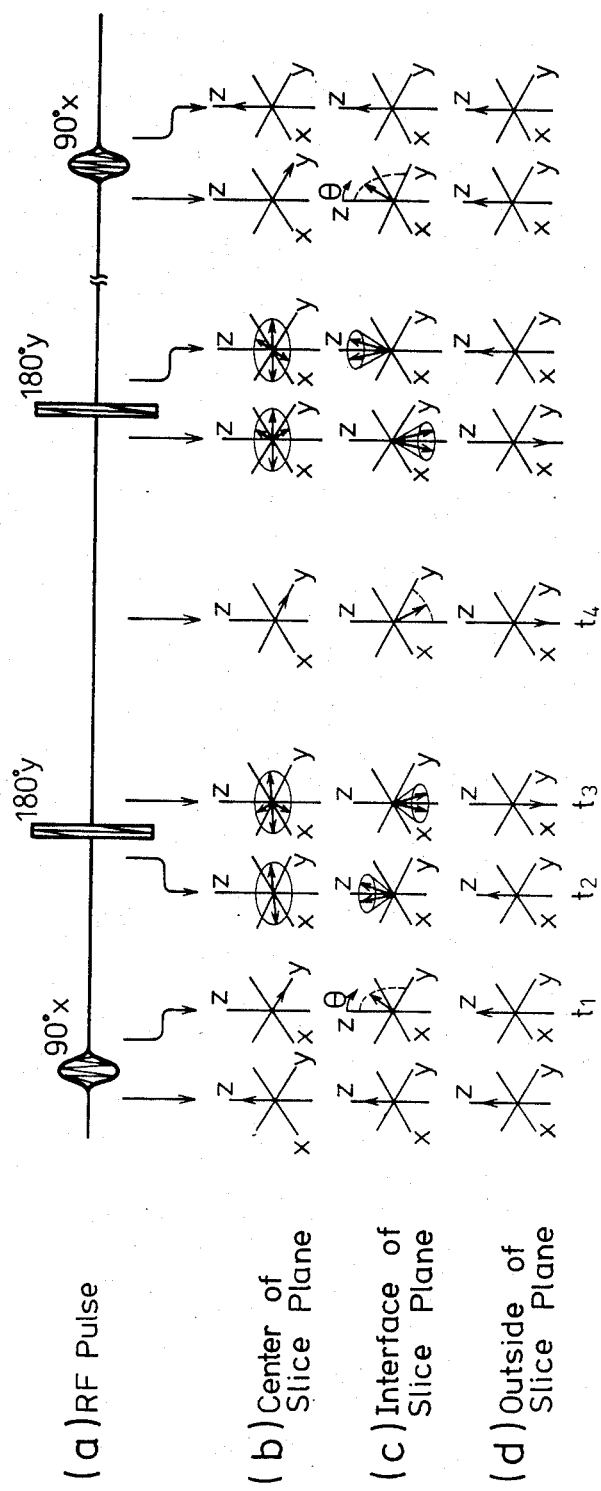

The movements of magnetization M in the above sequence are shown in FIGS. 26 and 27. FIGS. 26, 27 line (b) depict magnetization M in the center of a slice plane in which the magnetization M is rotated properly through 90° upon application of the 90° pulse. Line (c) depicts magnetization M at the interface of a slice plane in which the magnetization M is rotated through 90° upon application of the 90° pulse and through 180° upon application of the 180° pulse (since Gz = 0). Line (d) depicts magnetization M outside of a slice plane whereat the magnetization M is not affected upon application of the 90° pulse and is reversed in direction upon application of the 180° pulse.

FIG. 26 shows the movements of the magnetization M when time n is an odd number. After all magnetizations have been directed downwardly with the final $90°_x$ pulse, they are directed upwardly with the $180°_x$ pulse. In line (c), at the interface of the slice plane, the magnetization M is rotated only through $\theta°$ ($0<\theta<90°$) with the 90° pulse. Since the magnetization is angularly displaced $\theta°$ from the negative direction along the z axis immediately prior to the second 90° pulse, the magnetization M is directed upwardly with the $180°_{-x}$ pulse.

FIG. 27 shows the movement of the magnetization M when time n is an even number. Since the magnetization is angularly $\theta°$ from the positive direction along the z axis immediately prior to the second 90° pulse, the magnetization M may be directed upwardly with the $90°_{-x}$ pulse.

The NMR signal (see FIG. 25, line (e)) produced in the above sequence is sampled by the wave memory 11, and the sampled data is processed by computer 13 to reconstruct a two dimensional tomographic image of the object body, which is then displayed on display unit 14.

The present invention is not limited to the above described embodiments, but may be applied to other various methods and systems, such as, for example, are described hereinbelow.

Figure 28:
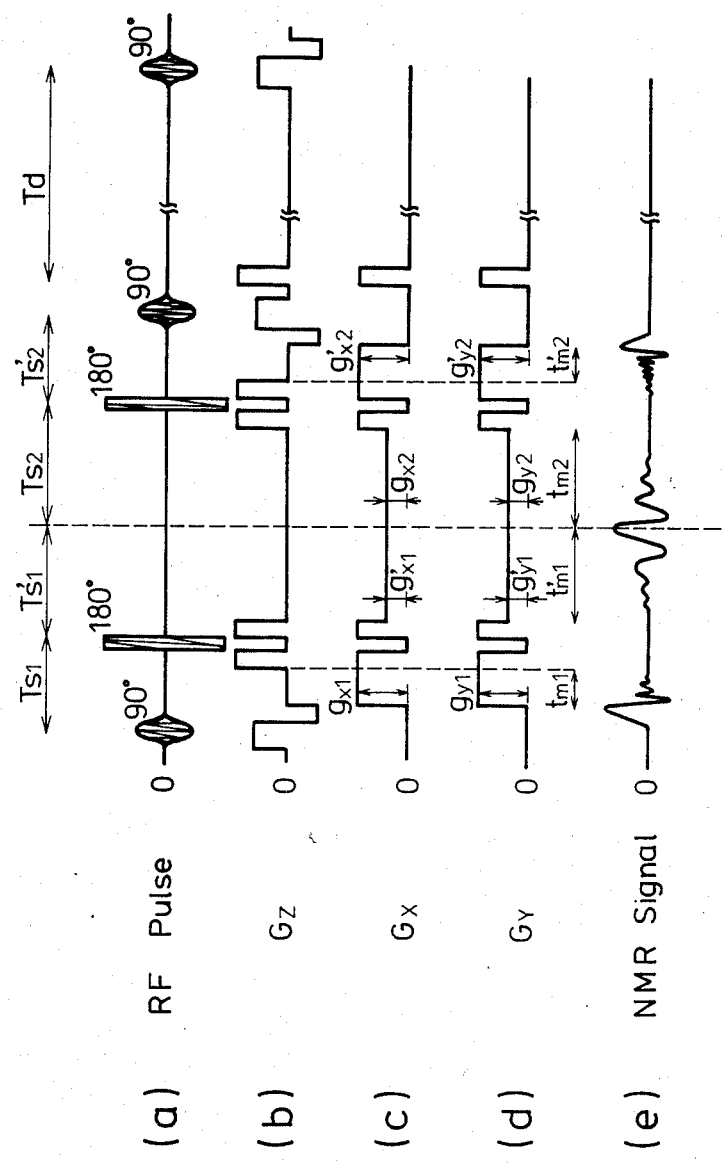

Further Illustrative Embodiments (1) As shown in FIG. 28 n=2, $g_{x1}>>g'_{x1}$, $g_{y1}>>g'_{y1}$, $g_{x2}><g'_{x2}$, and $g_{y2}<<g'_{y2}$. Since the signals at the periods $T_{s1}$, $T'_{s2}$ are subjected to influences due to the RF pulse and noise from Gx, Gy, Gz, they are not used, but the signals at periods $T'_{s1}$, $T_{s2}$ are used.

With the arrangement, since $t_{m1}<<t'_{m1}$ and $t_{m2}>>t'_{m2}$ from the above conditions, the time periods $t'_{m1}$, $t_{m2}$ are long, and signals can be picked up with a good S/N ratio.

Figure 29:
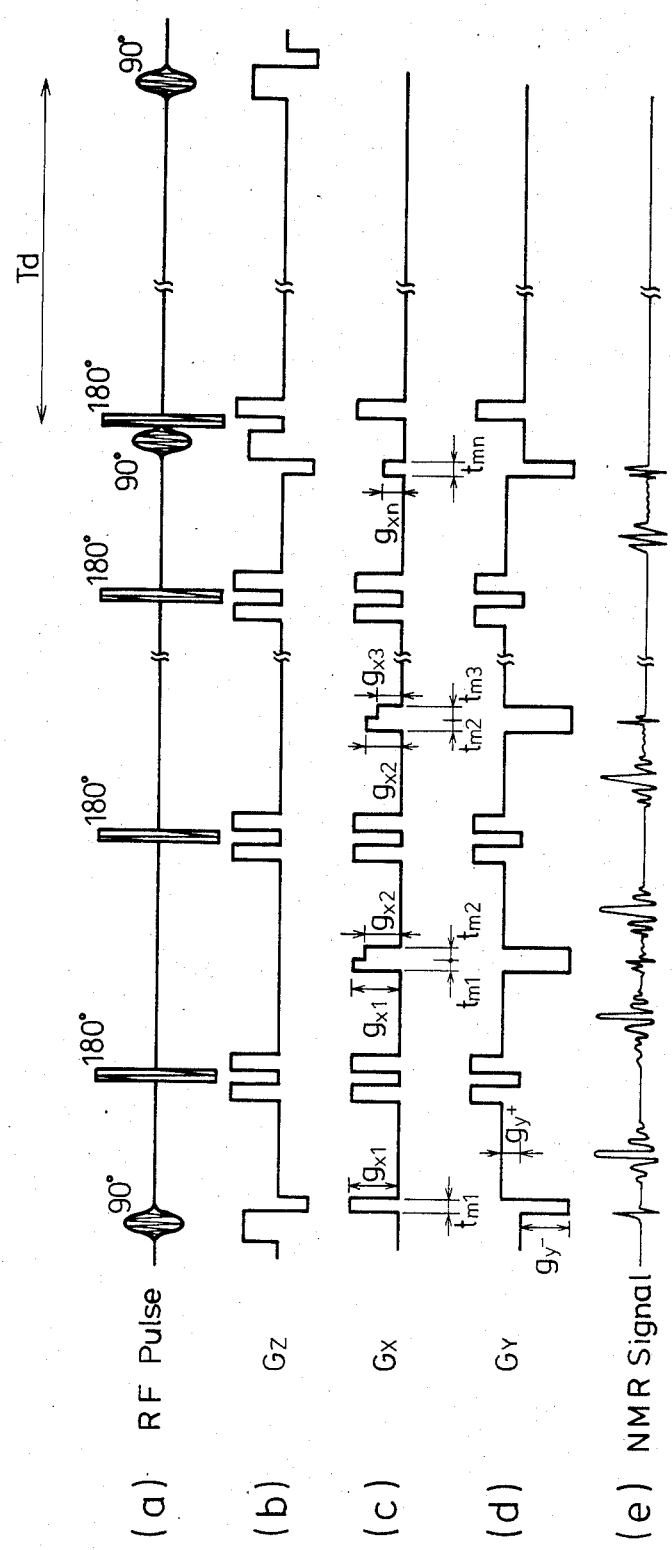

(2) The invention may be applied to a spin warp process. In FIG. 29, $g_{x1}, \ldots, g_{xn}$ are varied from time to time while keeping $t_{mp}$ (p=1−n) constant, to measure an NMR signal.

(3) The invention may be applied to a Fourier process. In FIG. 29, $t_{mp}$ is varied from time to time while keeping constant $g_{xp}$ (p=1−n); or $g_{xp}$ is varied from time to time while keeping $t_{mp}$ constant.

Another Fourier process in which the invention is incorporated is illustrated in FIG. 32 (wherein n is an odd number). An FID signal is observed with a phase variation given by a Gx gradient field in time period $T_{s1}$, and then a Gx gradient field of $g'_x$ is applied after a $180°_y$ pulse, whereupon a first echo signal varies in phase by $g'_x$ as compared with that of the FID signal (the echo signal is equivalent to the FID signal to which a phase variation (B) is given). Then, in response to the application of a Gx gradient field of $g''_x$, a second echo signal varies in phase by $g''_x$ (the echo signal is equivalent to the FID signal to which a phase variation (C) is given). $g'_x$, $g''_x \ldots$ may be applied prior to the 180° pulse, in which case the signs of $g'_x$, $g''_x$, $\ldots$ should be reversed to achieve the foregoing variation.

Furthermore, $g'_x$, $g''_x \ldots$ may be applied simultaneously with homogeneity spoil pulses before and after the 180° pulse. Where the phase variation is not required to vary from time to time, no $g'_x$, $g''_x$, are applied. After n 180° pulses have been applied, a Gx gradient field $g_x$ is applied to cancel the phase variation which has been given so far.

FIG. 33 illustrates an application wherein n=2. In this example, the following conditions must be met.

$$g_{x1} \cdot t_{m1} = g'_{x1} \cdot t'_{m1} \quad (13)$$

$$g_{x2} \cdot t_{m2} = g'_{x2} \cdot t'_{m2} \quad (14)$$

$$g_{y1} \cdot t_{m1} = -g'_{y2} \cdot t'_{m2} \quad (15)$$

To cancel irregularities of the static field, the following are satisfied.

$$T_{s1} = T'_{s1} \quad (16)$$

$$T_{s2} = T'_{s2} \quad (17)$$

To prevent the intensity of the gradient field while an echo is being observed, the following is satisfied.

$$g'_{x1} = g_{x2} \quad (18)$$

In FIGS. 29, 32, and 33, the effects of application of the gradient fields Gx, Gy are cancelled out by each other immediately prior to application of the second 90° pulse, and the magnetization vectors are in phase with each other except for $T_2$ relaxation.

Data obtained by the above Fourier processes is subjected to a two dimensional Fourier transform for constructing a two dimensional image.

Figure 30:
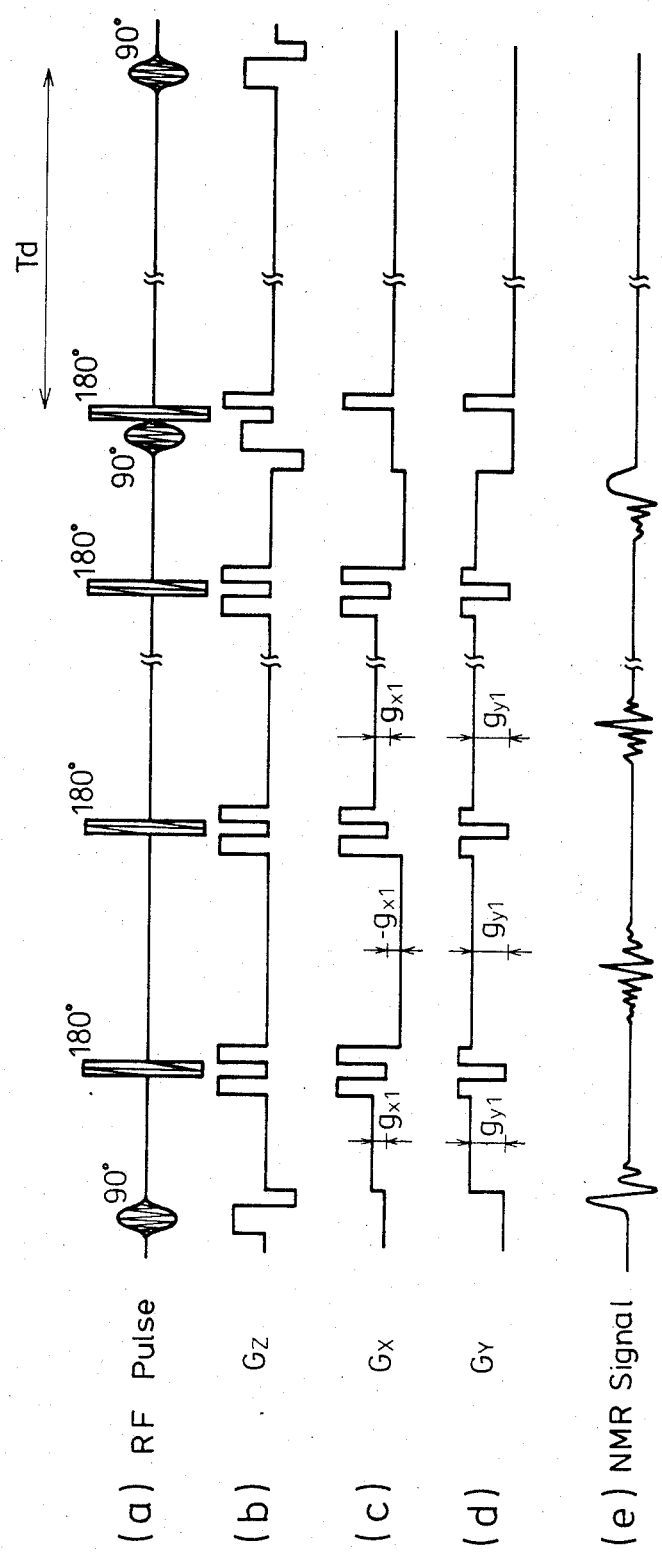

(4) The invention may be applied to an echo planar process. FIG. 30 shows such a process wherein n is an odd number. An ordinary echo planar process is effected by reversing the magnetic field (such as Gy, for example). However, an echo planar process according to the invention is carried out by applying a 180° pulse. Finally, the magnetization M is forcibly directed upwardly (with 90° and 180° pulses when n is an odd number, and with a 90° pulse when n is an even number).

(5) The invention is applicable to a selective excitation line process which is illustrated in FIG. 31 in which n is an odd number.

(6) The invention may be applied to an inversion recovery process wherein a 180° pulse is applied prior to a sequence of pulses. To avoid adverse effects on the transverse direction due to any inaccuracy of the 180° pulse, homogeneity spoil pulse are applied for all Gx, Gy, and Gz. However, such homogeneity spoil pulses need not be applied if adverse effects are not caused in the transverse direction or are negligible.

The inversion recovery process may be applied to all of the processes described herein before to obtain images in which $T_1$ (longitudinal relaxation time) is emphasized.

(7) In the processes set forth hereinbefore, the nonselective 180°-pulse may comprise a plurality of pulses. For example, the 180°$_y$ pulse may be replaced with a train of 90°$_x$, 180°$_y$, and 90°$_x$ pulses for cancelling any inaccuracy or other defects of pulse intensity.

(8) An image may be produced by effecting an interimage arithmetic operation fro a $T_1$ image, a $T_2$ image, a spin density image, and their combination.

For example, the intensity of V of the FID signal in the sequence of FIG. 25 meets above equation (6). The arithmetic operation is effected among a plurality of images obtained by changing $T_{s1}$, $T'_{s1}$, Td.

(9) The invention is applicable to a multi-slice process in which other planes are excited using the wait time of Td for obtaining information on the excited planes.

(10) The phase relationship between the pulses in the foregoing processes may be
90°$_x$—180°$_y$—180°$_y$ . . . —90°$_{-x}$ (wherein n is an even number).
90°$_x$—180°$_y$—180°$_y$ . . . —90°$_x$180°$_{-x}$ (n is an odd number)
and in addition,
90°$_x$ —(180°$_{-x}$ —180°$_x$)$^k$ . . . —90°$_{-x}$ (n is an even number)
90°$_x$ —(180°$_{-x}$ —180°$_x$)$^k$ . . . —90°$_x$ 180°$_{-x}$ (n is an odd number)

In the invention, after a number of spin echos have been observed, magnetizations are forcibly returned to a thermal equilibrium condition, and all magnetizations M are directed upwardly (in a positive direction on the z axis). Thus, the process can be shifted to a next operation with a small wait time Td, and the overall scanning time, advantageously, can be shortened when compared to the prior art.

Also, advantageously, in the invention, for an improved image quality, a number of similar data items are sampled and averaged as time series data items or averaged after they have been converted into an image, all in a period of time much shorter than the conventional time.

Another advantage enjoyed by the invention is that since the magnetization is switched around betwen "above an xy plane" and "below the xy plane" before and after the non-selective 180° pulse, the influence of $T_1$ relaxation is small. For example, in FIG. 27, the magnetization vector is displaced upwardly by $T_1$ between $t_1$ and $t_2$ to narrow the cone shown in FIG. 27, line (c), and displaced upwardly by $T_1$ between $t_3$ and $t_4$ to spread the cone shown in FIG. 27, line (c), thus cancelling each other.

Moreover, advantageously, application of homogengity spoil pulses eliminates components of magnetization and the correlationship between scans, so that the magnetization moves properly and noise is reduced.

Furthermore, by reducing both $T_{s1}$ and $T'_{s2}$ sufficiently as compared with $(T'_{s1} + T_{s2})$ at n=2, applied signals are not subjected to any influence of noise. With $T_{s1}$, $T'_{s2}$ being short, an NMR signal of high level can be obtained.

Also, by using a plurality of pulses for the 180° pulse, advantageously, errors of intensity are cancelled to allow proper rotation of magnetization.

Moreover, an image which suits a desired purpose can easily be obtained by effecting an interimage arithmetic operation.

Furthermore, advantageously, with the invention, apparent speed of operation can be increased by a multi-slice process.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. An examination apparatus utilizing nuclear magnetic resonance, comprising
    means for applying a static field ($H_0$) to an object being examined;
    means for applying a gradient field to said object;
    means for applying high frequency pulses to cause nuclei of atoms constituting a part of said object to effect nuclear magnetic resonance;
    means for detecting a nuclear magnetic resonance signal; and
    means for reconstructing an image of said object part from said detected nuclear magnetic resonance signal;
    wherein said apparatus further comprises control means comprising
    means for successively applying as said high frequency pulses a first 90° pulse for rotating the magnetizations in the slice plane by 90° from the direction of the static magnetic field, a first 180° pulse for rotating the magnetizations in scattering by 180°, a second 90° pulse for orienting the magnetizations collected in the slice plane and at the slice interface by the first 180° pulse to the axial direction of the static magnetic field, and a second 180° pulse substantially immediately after said second 90° pulse for rotating the magnetizations by 180° and orienting them to the direction of the static magnetic field only when the number of applications of said first 180° pulse is an odd number
    means for aligning the magnetizations in the slice plane and at the slice interface in the direction of the static magnetic field at the time of applying of said second 90° pulse or of applying said second 180° pulse by the successive applications of these pulses, thereby to shorten the wait time until the execution of the of the next pulse sequence and to prevent the reduction in the S/N ratio of the nuclear magnetic resonance signal due to the effects of the magnetizations at the slice interface;
    means for energizing said gradient field applying means to apply said gradient field to enable said first and second 90° pulses to effect selective excitation for exciting only a particular slice plane;

means for de-energizing said gradient field applying means thereby to not apply said gradient field to enable said first and second 180° pulses to effect non-selective exciation;

means for applying said second 180° pulse substantially immediately after said second 90° pulse has been applied; and means for detecting a nuclear magnetic resonance signal produced in a period $T_s$; between said first 90° pulse and said first 180° pulse or in a period $T_{s2}$ between said first 180° pulse and said second 90° pulse.

2. The apparatus of claim 1, wherein said means for detecting comprises means for detecting nuclear magnetic resonance signals in both of said periods $T_{s1}$ and $T_{s2}$; and said image reconstructing means utilizes data obtained by averaging said nuclear magnetic resonance signals for reconstructing said image.

3. The apparatus of claim 1, wherein said image reconstructing means uses nuclear magnetic resonance signals produced in said periods $T_{s1}$ and $T_{s2}$ and effects arithmetic operation on the signals to image a spin-spin relaxation time.

4. The apparatus of claim 1, wherein said first 90° pulse, said first 180° pulse, said second 90° pulse, and said second 180° pulse have the following phase relationship $90°_x, 180°_{-x}, 90°_{-x}, 180°_x$.

5. The apparatus of claim 1, wherein said first 90° pulse, said first 180° pulse, said second 90° pulse, and said second 180° pulse have the following phase relationship $90°_x, 180°_y, 9°_x, 180°_{-x}$.

6. The apparatus of claim 1, wherein a second gradient field is applied in a direction different from that of said first mentioned gradient field in said periods $T_{s1}$ and $T_{s2}$, and remains in the same direction in each of said periods $T_{s1}$ and $T_{s2}$, said second mentioned gradient field having an intensity and a direction have values required for imaging per sequence, thereby to produce an image from obtained nuclear magnetic resonance signals.

7. The apparatus of claim 1, wherein said gradient field applying means is under control of means for energizing in said second period $T_{s1}$ to apply a second gradient field in a direction different from that of said first mentioned gradient field to thereby give a phase variation, and for energizing successively to apply a third gradient field in a direction different from those of said first and second gradient fields, while switching said third gradient field between two values of different polarities, and to apply gradient fields in the same directions as those of said second and third gradient fields in said period $T_{s2}$, said second gradient field having an intensity and a time of application having values required for imaging per sequence, thereby to produce an image from obtained nuclear magnetic resonance signals.

8. The apparatus of claim 1 wherein said gradient field applying means is under control of means for energizing in said period $T_{s1}$ to apply a second gradient field in a different direction different from that of said first mentioned gradient field to thereby give a phase variation, and for successively energizing to apply a third gradient field in a direction different from those of said first and second gradient fields, and to apply gradient fields in the same directions as those of said second and third gradient fields in said period $T_{s2}$, said second gradient field having an intensity and a time of application having values for imaging per sequence, to produce an image from obtained nuclear magnetic resonance signals.

9. The apparatus of claim 1, wherein said gradient field applying means and said control means control the intensities of the fields to measure the nuclear magnetic resonance signal according to a selective excitation line process for reconstructing the image.

10. The apparatus of claim 1, wherein the application of said first 90° pulse comprises application of a 180° pulse for inversion recovery prior to an appropriate time.

11. The apparatus of claim 1, wherein said control means is capable of varying the intensity of the field or time of application thereof to shorten one of said periods while keeping equal integrals of the applied fields with respect to time, in said periods $T_{s1}$ and $T_{s2}$.

12. The apparatus of claim 1, wherein said control means varies at least one of said periods $T_{s1}$ and $T_{s2}$, and a period Td for producing a plurality of original images from which images can be generated by an interimage arithmetic operation between said images.

13. The apparatus of claim 1, wherein each of said 90° and 180° pulses comprises a plurality of pulses.

14. The apparatus of claim 1, wherein said control means is capable of effecting a pulse sequence on another slice plane during a wait time.

15. The apparatus of claim 1, wherein said control means is capable of applying a gradient field Gz as it oscillates frequently between positive and negative values when said first 90° pulse is applied.

16. The apparatus of claim 1, wherein said control means is capable of applying a homogeneity spoil pulse for each gradient field before and after the application of said first 180° pulse.

17. The apparatus of claim 1, wherein said control means is capable of applying a homogeneity spoil pulse between said second 90° pulse and said second 180° pulse.

18. The apparatus of claim 1, wherein said control means is capable of applying a homogeneity spoil pulse after said second 180° pulse has been applied.

19. An examination apparatus utilizing nuclear magnetic resonance, comprising means for applying a static magnetic field ($H_0$) to an object being examined;

means for applying gradient fields to said object;

means for applying high frequency pulses to cause nuclei of atoms constituting a part of said object to effect nuclear magnetic resonance;

means for detecting a nuclear magnetic resonance signal; and means for reconstructing an image of said object part from detected nuclear magnetic resonance signal;

wherein said apparatus further comprises control means comprising means for successively applying as said high frequency pulses a first 90° pulse for rotating the magnetizations in the slice plane by 90° from the direction of the static magnetic field from the direction of the static magnetic field, n 180° pulses for rotating the magnetizations in scattering by 180° a second 90° pulse for orienting the magnetizations collected in the slice plane and at the slice interface by the in 180° pulses to the axial direction of the static magnetic field, wherein said second 90° pulse is determined in relation to said n or said second 90° pulse and a succeeding 180° pulse for rotating the magnetizations by 180° and orienting them to the direction of the static magnetic field only when the number of applications of said n 180° pulses is an odd number;

means for aligning the magnetizations in the slice plane and at the slice interface in the direction of the static magnetic field at the time of applying of said second 90° pulse or applying of said succeeding 180° pulses by the successive application of these pulses, thereby to shorten the wait time until the execution of the pulse sequence and to prevent the reduction in the S/N ratio of the nuclear magnetic resonance signal due to the effects of the magnetizations at the slice interface;

means for applying said second 90° pulse only when said n is an even number and for applying said second 90° pulse and said succeeding 180° pulse when said n is an odd number;

means for energizing said gradient field applying means to apply said gradient field to enable said first and second 90° pulses to effect selective excitation for exciting only a particular slice plane;

means for de-energizing said gradient field applying means thereby not to apply said gradient field to enable said first and said second 180° pulses to effect non-selective excitation; and means for detecting a necessary one of nuclear magnetic resonance signals produced in a period after said first 90° pulse until said second 90° pulse and using the detected signal for reconstructing said image of said object part.

20. The apparatus of claim 19, wherein said control means increases one of said gradient fields applied before and after each of said repeatedly applied 180° pulses and makes time of application of one of said gradient fields shorter than time of application of another gradient field, said detecting means observing only an echo signal in a long period of time of application of said one of said gradient fields.

21. The apparatus of claim 19, wherein before and after said n 180° pulses are applied, after said first 90° pulse is applied, and before said second 90° pulse is applied, said control means operates said gradient field applying means so that the following equations are established at values required for imaging, thereby to apply a second gradient field in a direction different from that of said first mentioned gradient field, and thereby to produce an image from generated nuclear magnetic resonance signal $$g_{xp} \times t_{mp} = g'_{xp} \times t'_{mp}$$

$$g_{yp} \times t_{mp} = g'_{yp} \times t'_{mp}$$

wherein, p=1, 2, ... n; $t_{mp}$ is time of application of gradient field in a time $T_{sn}$ prior to application of the 180° pulse; $t'_{mp}$ is the time of application of gradient field in a time $T'_{sn}$ after application of the 180° pulse; $g_{xp}$ is magnitude of a component in direction of x axis of said second gradient field in $t_{mp}$; $g_{yp}$ is magnitude of a component in direction of y axis of the second gradient field in $t_{mp}$; $g'_{xp}$ is magnitude of a component in direction of x axis of the second gradient field in $t'_{mp}$; $g'_{yp}$ is magnitude of a component in direction of y axis of the second gradient field in $t'_{mp}$; and x axis and y axis are any selected axis serving to express vectors of the second gradient field, and extend perpendicular to each other, each axis extending in a direction different from that of the first gradient field.

22. The apparatus of claim 19, wherein in a period after said first 90° pulse has been applied, before the second 90° pulse is applied, and before and after said n 180° pulses are applied, said control means operates said gradient field applying means to apply a second gradient field in a direction different from that of said first mentioned gradient field to give a phase variation, and then operates said gradient field applying means to apply a third gradient field in a direction different from those of said first and second gradient fields while said third gradient field switches between two values of different polarities, and wherein said control means further controls the extent of application of said second and third gradient fields so that there will be no influence of said application of said second and third gradient fields, immediately before said second 90° pulse is applied, and causing the intensity and time of application of said second gradient field to be of values required for imaging within one sequence or per sequence, thereby to obtain an image from a produced nuclear magnetic resonance signal.

23. The apparatus of claim 19, wherein in a period after said first 90° pulse has been applied, before the second 90° pulse is applied, and before and after said n 180° pulses are applied, said control means operates said gradient field applying means to apply a second gradient field in a direction different from that of said first mentioned gradient field to give a phase variation, and then said control means operates said gradient field applying means to apply a third gradient field in a direction different from those of said first and second gradient fields, and wherein said control means further controls the extent of application of said second and third gradient fields so that there will be no influence of application of said second and third gradient fields, immediately before said second 90° pulse is applied, and causing the intensity and time of application of said second gradient field to be of values required for imaging within one sequence of per sequence, thereby to obtain an image from a produced nuclear magnetic resonance signal.

24. The apparatus of claim 19, wherein said control means controls said gradient field applying means to control field application while utilizing an echo planar process or a selective excitation line process.

25. The apparatus of claim 19, wherein said control means applies a 180° pulse for inversion recovery prior to application of said first 90° pulse.

26. The apparatus of claim 19, wherein said control means applies, instead of said 180° pulse, three pulses comprising said 180° pulse and two 90° pulses before and after said 180° pulse, said two 90° pulses being 90° out of phase with said 180° pulse and in phase with each other.

27. The apparatus of claim 19, wherein said control means applies homogeneity spoil pulses for said gradient fields immediately before and after said repeated 180° pulses are applied.

28. The apparatus of claim 19, wherein said control means applies a 180° pulse after a last 90° pulse; and wherein said control means applies homogeneity spoil pulses for said gradient fields after the 90° pulse applied after said repeated 180° pulses or after the 180° pulse applied immediately after said last mentioned 90° pulse.

29. The apparatus of claim 19, wherein said control means repeatedly varies the time of application of said gradient field, said image reconstructing means producing at least one of a $T_1$ image, a $T_2$ image, a spin density image, and a combination of these images through an interimage arithmetic operation on a plurality of images obtained by varying time parameters.

30. The apparatus of claim 19, wherein said control means selectively excites another slice plane for multi-slice operation during a wait time after one pulse sequence and before a next pulse sequence.

31. An examination method utilizing nuclear magnetic resonance wherein magnetic fields and high-frequency pulses are applied to the nuclei of atoms constituting a tissue of an object being examined to cause the nuclei to effect nuclear magnetic resonance for reconstructing an image of the tissue based on a produced nuclear magnetic resonance signal, said method comprising the steps of using, as said high-frequency pulses, a first 90° pulse for rotating the magnetizations in the slice plane by 90° from the direction of the static magnetic field, a first 180° pulse for rotating the magnetizations in scattering by 180°, a second 90° pulse for orienting the magnetizations collected in the slice plane and at the slice interface by the first 180° pulse to the axial direction of the static magnetic field and a second 180° pulse succeeding said second 90° pulse for rotating the magnetizations by 180° and orienting them to the direction of the static magnetic field only when the number of applications of said first 180° pulse is an odd number;

aligning the magnetizations in the slice plane and at the slice interface in the direction of the static magnetic field at the time of applying of said second 90° pulse or of applying of said second 180° pulse by the successive application of these pulses, thereby to shorten the wait time until the execution of the next pulse sequence and to prevent the reduction in the S/N ratio of the nuclear magnetic resonance signal due to the effects of the magnetizations at the slice interface;

detecting required signals among the nuclear magnetic resonance signals obtained during a period from the application of said first 90° pulse to the application of said second 90° pulse and reconstructing an image of the tissue of the object being examined.

32. The method of claim 31, wherein in applying magnetic fields, gradient magnetic fields of intensity necessary for imaging and whose directions differ from the direction of the static magnetic field, are applied selectively before and after repetitive applications of the 180° pulses.

33. The method of claim 31, wherein in applying magnetic fields, gradient magnetic fields are applied while changing their time intervals of application each time the 180° pulse is applied repetitively; and wherein in reconstructing an image, one or more and combinations thereof, are selected by an inter-image arithmetic operation effected on a plurality of images obtained.

34. The method of claim 31, wherein applying magnetic fields and high-frequency pulses, at the time the first and second 90° pulses are applied, a selective excitation mode is used wherein a first gradient magnetic field is applied simultaneously to excite a particular slice plane, and at the time the first and second 180° pulses are applied, a non-selective excitation mode is used wherein no gradient magnetic field is applied.

35. The method of claim 31, wherein in reconstructing an image relating to the tissue on the basis of the nuclear magnetic resonance signal, data obtained by averaging a plurality of nuclear magnetic resonance signals detected in each pulse sequence is used.

36. The method of claim 31, wherein in reconstructing an image, plurality of nuclear magnetic resonance signals, detected in each pulse sequence, are used and a spin-spin relaxation time is visualized through an arithmetic process.

37. The method of claim 31, wherein the relationship of phase of the first 90° pulse, a first 180° pulse, second 90° pulse, and second 180°pulse is set to either a group of $90°_x$, $180°_y$, $90°{-x}$, and $180°_x$, or another group of $90°_x$, $180°_x$, $90°_x$, and $180°{-x}$.

38. The method of claim 31, wherein other gradient magnetic fields, differing in direction from a first gradient magnetic field, are applied in a period $T_{s1}$ extending from application of the first 90° pulse to application of the first 180° pulse, and in a period $T_{s2}$ extending from application of the first 180° pulse to application of the second 90° pulse.

39. The method of claim 38, wherein each pulse sequence, the other gradient magnetic fields are unchanged in direction between periods $T_{s1}$ and $T_{s2}$, and their intensities and directions are set to values necessary for imaging.

40. The method of claim 38, wherein the other gradient magnetic fields are a second gradient magnetic field differing in direction from the first gradient magnetic field and a third gradient magnetic field differing in direction from the first and second gradient magnetic fields; and wherein in the period $T_{s1}$, the second gradient magnetic field is applied to cause a change of phase and the third gradient magnetic field is applied either at a given intensity or while switching its intensity between two values of different polarities; and wherein in the period $T_{s2}$, other gradient magnetic fields of the same directions as those of the second and third gradient magnetic fields are applied, respectively; and wherein in each pulse sequence, the intensity and the time interval of application of the second gradient magnetic field are set to values necessary for imaging.

41. The method of claim 31, wherein either the intensity or the time interval of application of each gradient magnetic field being applied is changed while keeping unchanged its integral of intensity with respect to time between a period $T_{s1}$ extending from application of the first 90° pulse to application of the first 180° pulse and a period $T_{s2}$ extending from application of the first 180° pulse to application of the second 90° pulse, to thereby shorten either one of the periods with respect to the other.

42. The method of claim 31, wherein the application of each of the 90° pulse and the 180° pulse is realized by the application of a plurality of pulses.

43. The method of claim 31, wherein during a wait time of each pulse sequence, a similar pulse sequence is performed with respect to other slice planes.

44. The method of claim 31, wherein when the first 90° pulse is applied, a gradient magnetic field, whose axis is directed in the same direction as that of the static magnetic field, is applied while being oscillated a number of times in the positive and negative directions.

45. The method of claim 31, wherein in applying magnetic fields, a homogeneity spoil pulse is applied with respect to each gradient magnetic field before and after application of the first 180° pulse.

46. The method of claim 31, wherein in applying magnetic fields, a spoil pulse is applied during the interval between application of the second 90° pulse and the application of the second 180° pulse and/or after application of the second 180° pulse.

47. The method of claim 31, wherein the 180° pulse is accompanied by two 90° pulses disposed on either side thereof and whose phases are identical to each other and differ 90° from that of the 180° pulse.

* * * * *